United States Patent
Seki et al.

(10) Patent No.: US 11,417,674 B2
(45) Date of Patent: Aug. 16, 2022

(54) SEMICONDUCTOR MEMORY DEVICE AND METHOD OF MANUFACTURING SEMICONDUCTOR MEMORY DEVICE

(71) Applicant: Kioxia Corporation, Minato-ku (JP)

(72) Inventors: Harumi Seki, Kawasaki (JP); Yuichiro Mitani, Miuragun (JP)

(73) Assignee: Kioxia Corporation, Minato-ku (JP)

( * ) Notice: Subject to any disclaimer, the term of this patent is extended or adjusted under 35 U.S.C. 154(b) by 106 days.

(21) Appl. No.: 17/000,523

(22) Filed: Aug. 24, 2020

(65) Prior Publication Data
US 2021/0249420 A1 Aug. 12, 2021

(30) Foreign Application Priority Data

Feb. 6, 2020 (JP) .............................. JP2020-018908

(51) Int. Cl.
*H01L 27/1157* (2017.01)
*H01L 27/11582* (2017.01)
(Continued)

(52) U.S. Cl.
CPC ............ *H01L 27/1157* (2013.01); *G11C 8/14* (2013.01); *H01L 27/11565* (2013.01); *H01L 27/11578* (2013.01)

(58) Field of Classification Search
CPC ........... H01L 27/1157; H01L 27/11565; H01L 27/11578; H01L 29/40117; H01L 27/11582; G11C 8/14
See application file for complete search history.

(56) References Cited

U.S. PATENT DOCUMENTS 8,253,189 B2 * 8/2012 Sekine .............. H01L 27/11578
257/E29.309
10,153,262 B2 12/2018 Isogai et al.
(Continued)

FOREIGN PATENT DOCUMENTS

JP 2010-056533 A 3/2010
JP 2011-146631 A 7/2011
(Continued)

OTHER PUBLICATIONS

Degraeve et al., "Electrical defects in dielectrics for flash memories studied by Trap Spectroscopy by Charge Injection and Sensing (TSCIS)", Extended Abstracts of the 2009 International Conference on Solid State Devices and Materials, 2009, pp. 150-151.

*Primary Examiner* — Shahed Ahmed
*Assistant Examiner* — Khatib A Rahman
(74) *Attorney, Agent, or Firm* — Oblon, McClelland, Maier & Neustadt, L.L.P.

(57) ABSTRACT

A semiconductor memory device according to an embodiment includes: a semiconductor layer; a gate electrode layer; a first insulating layer provided between the semiconductor layer and the gate electrode layer, the first insulating layer containing silicon (Si), nitrogen (N), and fluorine (F), and the first insulating layer including a first region; a second insulating layer provided between the first insulating layer and the gate electrode layer; and a charge storage layer provided between the first insulating layer and the second insulating layer, the charge storage layer containing silicon (Si) and nitrogen (N), and the charge storage layer including a second region, in which a second atomic ratio (N/Si) in the second region is larger than a first atomic ratio (N/Si) in the first region, and in which a first fluorine concentration in the first region is higher than a second fluorine concentration in the second region.

15 Claims, 24 Drawing Sheets

(51) Int. Cl.
*G11C 8/14* (2006.01)
*H01L 27/11565* (2017.01)
*H01L 27/11578* (2017.01)

(56) References Cited

U.S. PATENT DOCUMENTS

| | | | | |
|---|---|---|---|---|
| 2009/0181531 | A1* | 7/2009 | Chae | H01L 29/66833 |
| | | | | 257/E21.21 |
| 2009/0261403 | A1* | 10/2009 | Sekine | H01L 29/513 |
| | | | | 257/E21.21 |
| 2009/0273021 | A1* | 11/2009 | Sekine | H01L 29/4234 |
| | | | | 257/326 |
| 2010/0006923 | A1* | 1/2010 | Fujitsuka | H01L 29/40117 |
| | | | | 257/E21.21 |
| 2010/0019312 | A1* | 1/2010 | Sekine | H01L 27/11578 |
| | | | | 257/326 |
| 2010/0052035 | A1* | 3/2010 | Koike | H01L 27/11521 |
| | | | | 257/E29.304 |
| 2010/0059808 | A1* | 3/2010 | Zheng | H01L 29/4234 |
| | | | | 257/E21.294 |
| 2010/0072539 | A1* | 3/2010 | Yasuda | H01L 29/517 |
| | | | | 257/326 |
| 2011/0175157 | A1* | 7/2011 | Sekine | H01L 27/11578 |
| | | | | 257/E21.423 |
| 2014/0273372 | A1 | 9/2014 | Sakuma | |
| 2016/0351576 | A1* | 12/2016 | Yamazaki | H01L 27/11582 |
| 2017/0077115 | A1 | 3/2017 | Ino et al. | |
| 2018/0219021 | A1* | 8/2018 | Daycock | H01L 27/11582 |
| 2019/0013404 | A1* | 1/2019 | Carlson | H01L 27/11524 |
| 2019/0081144 | A1* | 3/2019 | Isogai | H01L 21/02332 |
| 2019/0371814 | A1 | 12/2019 | Yamasaka | |

FOREIGN PATENT DOCUMENTS

| | | |
|---|---|---|
| JP | 5224889 B2 | 7/2013 |
| JP | 5443873 B2 | 3/2014 |
| JP | 2014-179530 A | 9/2014 |
| JP | 6448503 B2 | 1/2019 |

\* cited by examiner

B-B' CROSS SECTION

A-A' CROSS SECTION

C-C' CROSS SECTION

D-D' CROSS SECTION

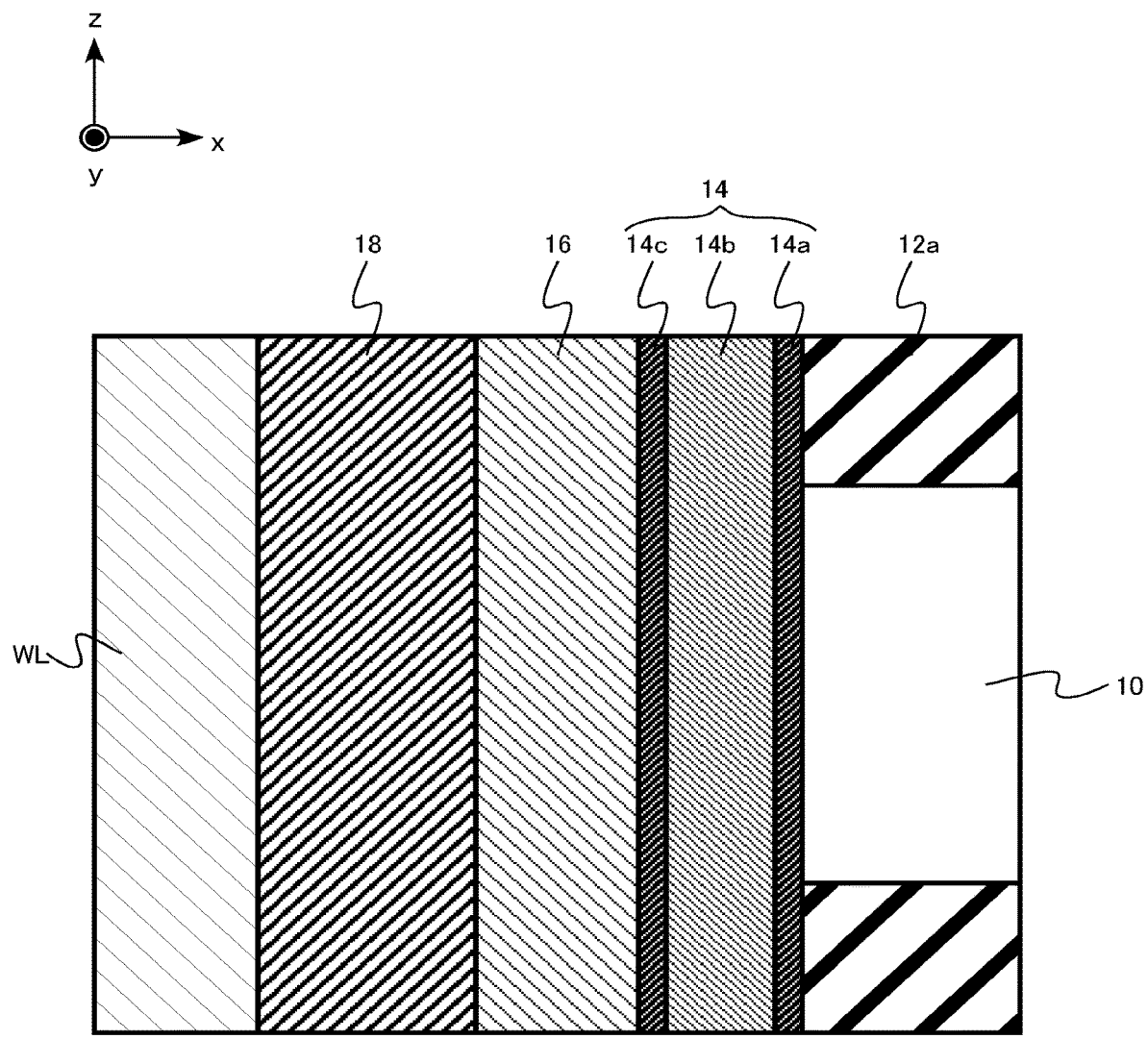

SEMICONDUCTOR MEMORY DEVICE AND METHOD OF MANUFACTURING SEMICONDUCTOR MEMORY DEVICE

CROSS-REFERENCE TO RELATED APPLICATION

This application is based upon and claims the benefit of priority from Japanese Patent Application No. 2020-018908, filed on Feb. 6, 2020, the entire contents of which are incorporated herein by reference.

FIELD

Embodiments described herein relate generally to a semiconductor memory device and a method of manufacturing semiconductor memory device.

BACKGROUND

A three-dimensional NAND flash memory in which memory cells are disposed three-dimensionally realizes high integration and low cost. In a three-dimensional NAND flash memory, for example, a memory hole penetrating a stacked body is formed in the stacked body in which a plurality of insulating layers and a plurality of gate electrode layers are alternately stacked. By forming a charge storage layer and a semiconductor layer in the memory hole, a memory string in which a plurality of memory cells are connected in series is formed. Data is stored in the memory cell by controlling the amount of charge stored in the charge storage layer.

BRIEF DESCRIPTION OF THE DRAWINGS

FIG. 24 is a schematic cross-sectional view of a memory cell of the semiconductor memory device according to the third embodiment.

DETAILED DESCRIPTION

Figure 1:
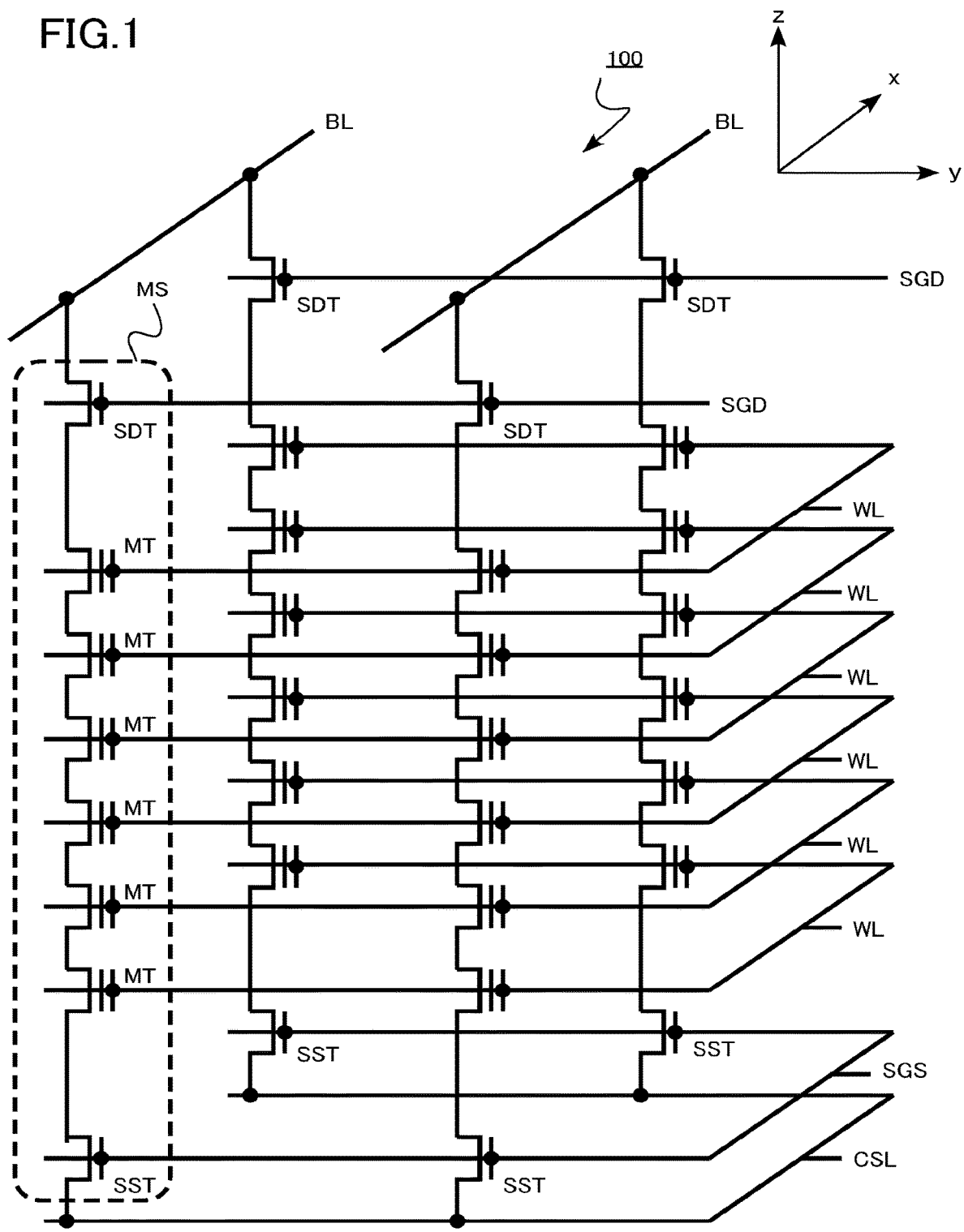
FIG. 1 is a circuit diagram of a memory cell array of a semiconductor memory device according to the first embodiment.

A semiconductor memory device according to an embodiment includes: a semiconductor layer; a gate electrode layer; a first insulating layer provided between the semiconductor layer and the gate electrode layer, the first insulating layer containing silicon (Si), nitrogen (N), and fluorine (F), and the first insulating layer including a first region; a second insulating layer provided between the first insulating layer and the gate electrode layer; and a charge storage layer provided between the first insulating layer and the second insulating layer, the charge storage layer containing silicon (Si) and nitrogen (N), the charge storage layer containing or not containing fluorine (F), and the charge storage layer including a second region, in which a second atomic ratio (N/Si) of nitrogen (N) to silicon (Si) in the second region is larger than a first atomic ratio (N/Si) of nitrogen (N) to silicon (Si) in the first region, and in which a first fluorine concentration in the first region is higher than a second fluorine concentration in the second region.

Hereinafter, embodiments of the present disclosure will be described with reference to the drawings. In the following description, the same or similar members will be denoted by the same reference numerals, and the description of members that have been described once will be appropriately omitted.

Further, in this specification, the terms "upper" or "lower" may be used for convenience. "Upper" or "lower" is a term indicating a relative positional relationship in the drawing, for example. The term "upper" or "lower" does not necessarily mean a positional relationship with respect to gravity.

Qualitative analysis and quantitative analysis of chemical compositions of members constituting the semiconductor memory device in the present specification can be carried out by, for example, Secondary Ion Mass Spectrometry (SIMS) or Energy Dispersive X-Ray Spectroscopy (EDX). Moreover, for example, Transmission Electron Microscope (TEM) can be used to measure the thickness of the members forming the semiconductor memory device, the distance between the members, and the like.

First Embodiment

A semiconductor memory device according to the first embodiment includes: a semiconductor layer; a gate electrode layer; a first insulating layer provided between the semiconductor layer and the gate electrode layer, the first insulating layer containing silicon (Si), nitrogen (N), and fluorine (F), and the first insulating layer including a first region; a second insulating layer provided between the first insulating layer and the gate electrode layer; and a charge storage layer provided between the first insulating layer and the second insulating layer, the charge storage layer containing silicon (Si) and nitrogen (N), the charge storage layer containing or not containing fluorine (F), and the charge storage layer including a second region, in which a second atomic ratio (N/Si) of nitrogen (N) to silicon (Si) in the second region is larger than a first atomic ratio (N/Si) of nitrogen (N) to silicon (Si) in the first region, and in which a first fluorine concentration in the first region is higher than a second fluorine concentration in the second region.

In addition, a semiconductor memory device according to the first embodiment includes: a plurality of gate electrode layers repeatedly disposed in a first direction so as to be spaced apart from each other; a semiconductor layer extending the first direction; a first insulating layer provided between the semiconductor layer and at least one gate electrode layer of the plurality of gate electrode layers, the first insulating layer containing silicon (Si), nitrogen (N), and fluorine (F), and the first insulating layer including a first region; a second insulating layer provided between the first insulating layer and the at least one gate electrode layer; and a charge storage layer provided between the first insulating layer and the second insulating layer, the charge storage layer containing silicon (Si) and nitrogen (N), the charge storage layer containing or not containing fluorine (F), and the charge storage layer including a second region, in which a second atomic ratio (N/Si) of nitrogen (N) to silicon (Si) in the second region is larger than a first atomic ratio (N/Si) of nitrogen (N) to silicon (Si) in the first region, and in which a first fluorine concentration in the first region is higher than a second fluorine concentration in the second region.

The semiconductor memory device according to the first embodiment is a three-dimensional NAND flash memory. A memory cell of the semiconductor memory device according to the first embodiment is a so-called Metal-Oxide-Nitride-Oxide-Semiconductor type (MONOS type) memory cell.

FIG. 1 is a circuit diagram of a memory cell array of the semiconductor memory device according to the first embodiment.

As shown in FIG. 1, a memory cell array 100 of the three-dimensional NAND flash memory of the first embodiment includes a plurality of word lines WL, a common source line CSL, a source selection gate line SGS, a plurality of drain selection gate lines SGD, a plurality of bit lines BL, and a plurality of memory strings MS. The word line WL is an example of a gate electrode layer.

The plurality of word lines WL are disposed apart from each other in the z direction. The plurality of word lines WL are stacked and disposed in the z direction. The plurality of memory strings MS extend in the z direction. The plurality of bit lines BL extend in the x direction, for example.

Hereinafter, the x direction is defined as the second direction, the y direction is defined as the third direction, and the z direction is defined as the first direction. The x direction, the y direction, and the z direction are, for example, perpendicular to each other.

As shown in FIG. 1, the memory string MS includes a source selection transistor SST, a plurality of memory cells, and a drain selection transistor SDT, which are connected in series between the common source line CSL and the bit line BL. One memory string MS is selected by selecting one bit line BL and one drain selection gate line SGD, and one memory cell can be selected by selecting one word line WL. The word line WL is a gate electrode of a memory cell transistor MT that constitutes the memory cell.

Figure 2A:
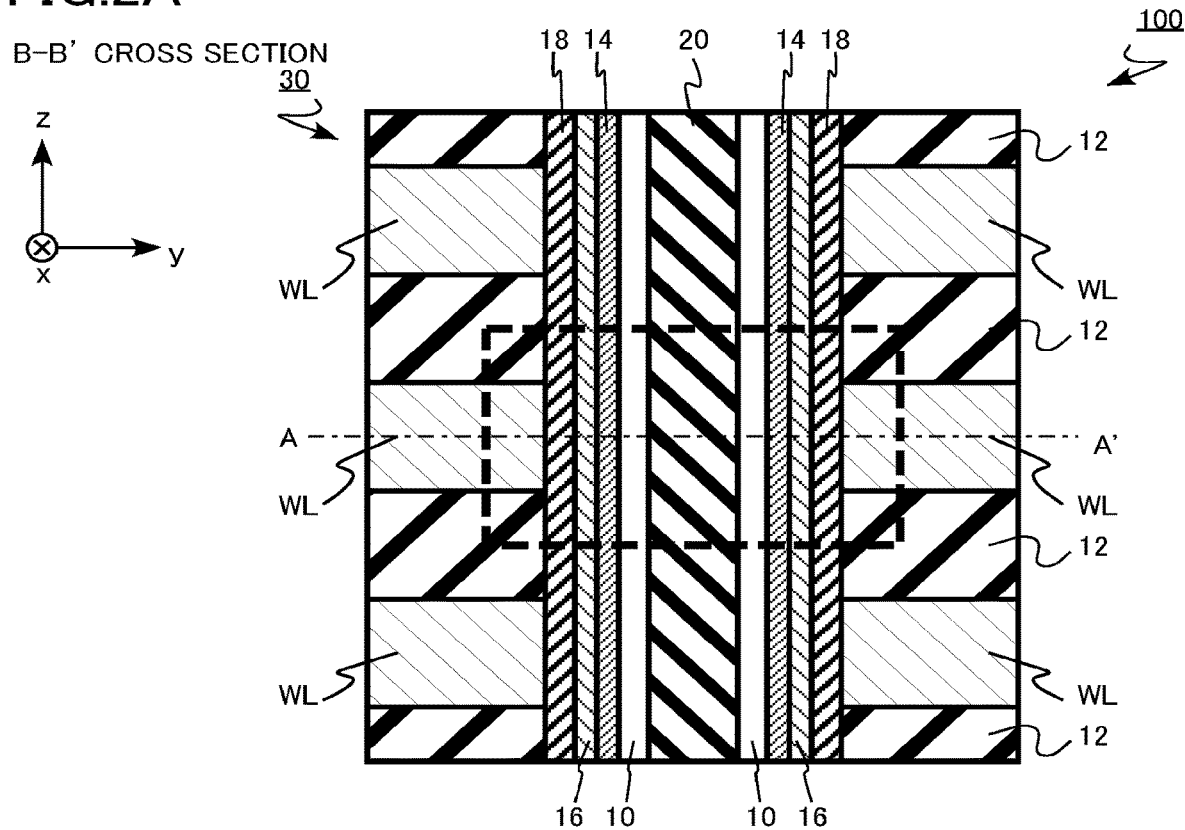
FIGS. 2A and 2B are schematic cross-sectional views of the memory cell array of the semiconductor memory device according to the first embodiment.
Figure 2B:
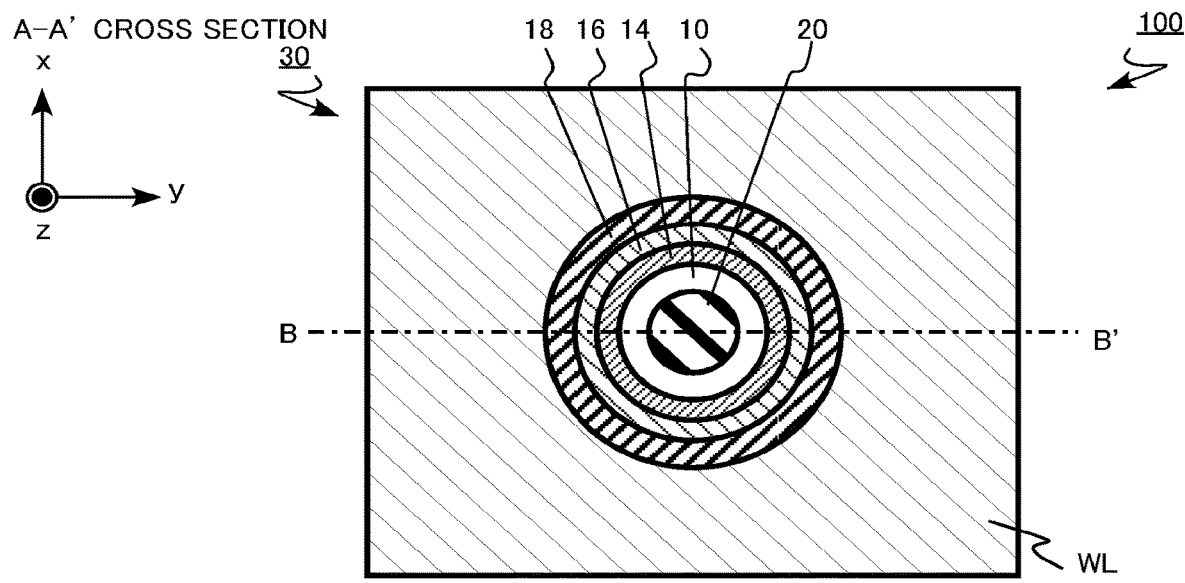

FIGS. 2A and 2B are schematic cross-sectional views of the memory cell array of the semiconductor memory device according to the first embodiment. FIGS. 2A and 2B show a cross section of a plurality of memory cells in one memory string MS surrounded by, for example, the dotted line, in the memory cell array 100 of FIG. 1.

FIG. 2A is a yz cross-sectional view of the memory cell array 100. FIG. 2A is a cross section taken along the line B-B' of FIG. 2B. FIG. 2B is an xy cross-sectional view of the memory cell array 100. FIG. 2B is a cross section taken along line A-A' of FIG. 2A. In FIG. 2A, the region surrounded by the broken line is one memory cell.

Figure 3:
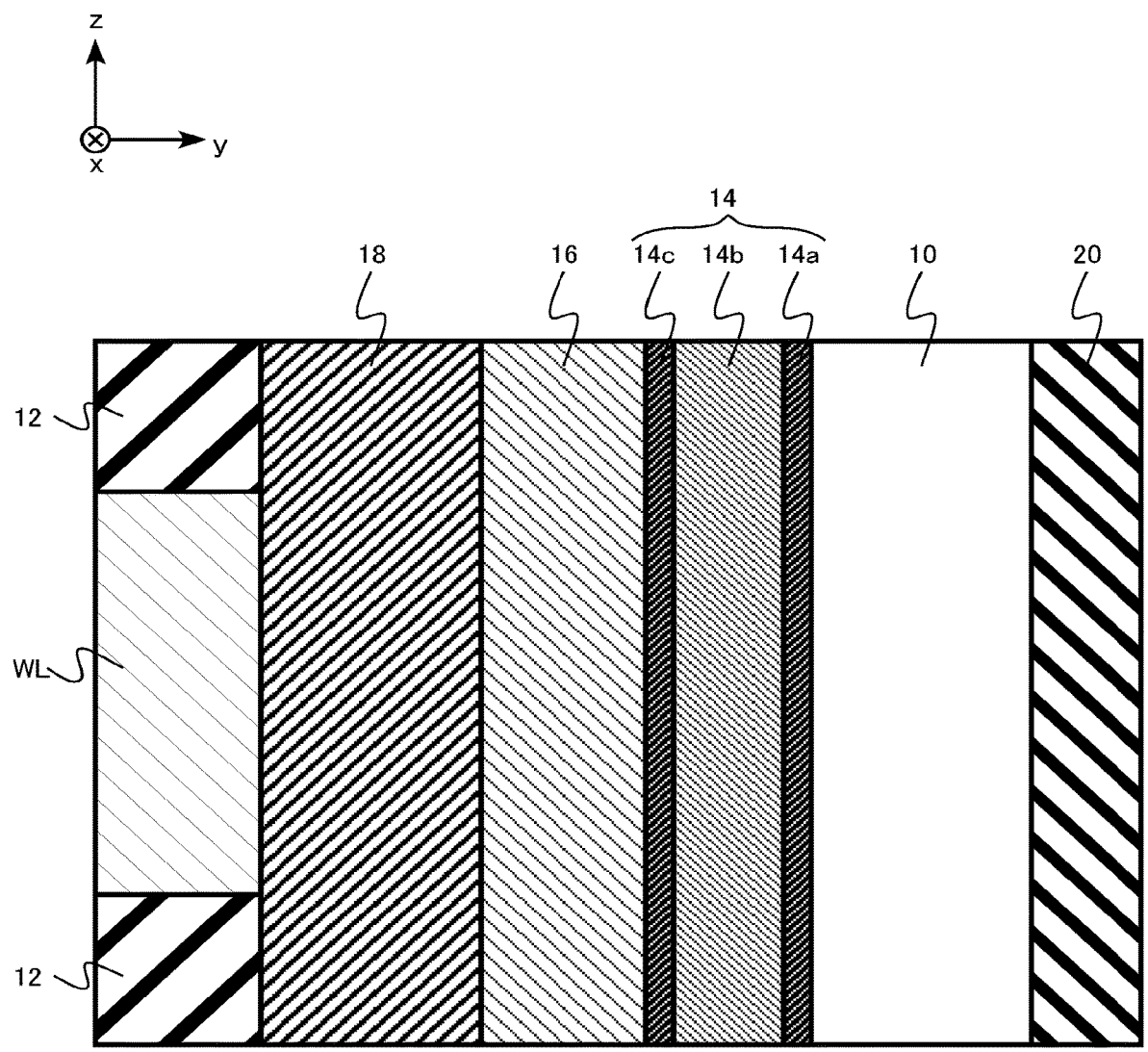
FIG. 3 is a schematic cross-sectional view of a memory cell of the semiconductor memory device according to the first embodiment.

FIG. 3 is a schematic cross-sectional view of the memory cell of the semiconductor memory device according to the first embodiment. FIG. 3 is an enlarged cross-sectional view of a part of the memory cell.

As shown in FIGS. 2A, 2B, and 3, the memory cell array 100 includes the plurality of word lines WL, a semiconductor layer 10, a plurality of interlayer insulating layers 12, a tunnel insulating layer 14, a charge storage layer 16, a block insulating layer 18, and a core insulating region 20.

The plurality of word lines WL and the plurality of interlayer insulating layers 12 form a stacked body 30. The tunnel insulating layer 14 includes a lower layer portion 14a, an intermediate portion 14b, and an upper layer portion 14c.

The word line WL is an example of a gate electrode layer. The tunnel insulating layer 14 is an example of a first insulating layer. The block insulating layer 18 is an example of a second insulating layer. The core insulating region 20 is an example of an insulating region.

The memory cell array 100 is provided, for example, on a semiconductor substrate (not shown). The semiconductor substrate has a face parallel to the x direction and the y direction.

The word lines WL and the interlayer insulating layers 12 are alternately stacked in the z direction (first direction) on the semiconductor substrate. The word lines WL are disposed apart from each other in the z direction. The word lines WL are repeatedly disposed in the z direction so as to be apart from each other. The plurality of word lines WL and the plurality of interlayer insulating layers 12 form a stacked body 30. The word line WL functions as a control electrode of the memory cell transistor MT.

The word line WL is a plate-shaped conductor. The word line WL is, for example, metal, metal nitride, metal carbide, or a semiconductor. The word line WL is, for example, tungsten (W). The thickness of the word line WL in the z direction is, for example, 5 nm or more and 20 nm or less.

The interlayer insulating layer 12 separates the word line WL from the word line WL. The interlayer insulating layer 12 electrically separates the word line WL from the word line WL.

The interlayer insulating layer 12 is, for example, oxide, oxynitride, or nitride. The interlayer insulating layer 12 is, for example, silicon oxide. The thickness of the interlayer insulating layer 12 in the z direction is, for example, 5 nm or more and 20 nm or less.

The semiconductor layer 10 is provided in the stacked body 30. The semiconductor layer 10 extends in the z direction. The semiconductor layer 10 extends in a direction perpendicular to the face of the semiconductor substrate.

The semiconductor layer 10 is provided so as to penetrate the stacked body 30. The semiconductor layer 10 is surrounded by the plurality of word lines WL. The semiconductor layer 10 has, for example, a cylindrical shape. The semiconductor layer 10 functions as a channel of the memory cell transistor MT.

The semiconductor layer 10 is, for example, a polycrystalline semiconductor. The semiconductor layer 10 is, for example, polycrystalline silicon. The semiconductor layer 10 contains, for example, fluorine (F).

The tunnel insulating layer 14 is provided between the semiconductor layer 10 and the word lines WL. The tunnel insulating layer 14 is provided between the semiconductor layer 10 and at least one of the plurality of word lines WL. The tunnel insulating layer 14 is provided between the semiconductor layer 10 and the charge storage layer 16.

The tunnel insulating layer 14 has a function of passing charges according to the voltage applied between the word lines WL and the semiconductor layer 10.

The tunnel insulating layer 14 contains silicon (Si), nitrogen (N), and fluorine (F). The tunnel insulating layer 14 includes a first region. The first region is at least a part of the tunnel insulating layer 14. The tunnel insulating layer 14 contains oxygen (O), for example.

The tunnel insulating layer 14 contains, for example, silicon nitride or silicon oxynitride. The thickness of the tunnel insulating layer 14 is, for example, 3 nm or more and 8 nm or less.

The tunnel insulating layer 14 may include a lower layer portion 14a, an intermediate portion 14b, and an upper layer portion 14c. The lower layer portion 14a is provided between the semiconductor layer 10 and the intermediate portion 14b. The intermediate portion 14b is provided between the lower layer portion 14a and the upper layer portion 14c. The upper layer portion 14c is provided between the intermediate portion 14b and the charge storage layer 16.

The lower layer portion 14a is, for example, silicon oxide. The intermediate portion 14b is, for example, silicon nitride or silicon oxynitride. The upper layer portion 14c is, for example, silicon oxide.

The charge storage layer 16 is provided between the tunnel insulating layer 14 and the block insulating layer 18.

The charge storage layer 16 has a function of trapping and storing charges. The charge is, for example, an electron. The threshold voltage of the memory cell transistor MT changes according to the amount of charges stored in the charge storage layer 16. By utilizing this change in threshold voltage, one memory cell can store data.

For example, as the threshold voltage of the memory cell transistor MT changes, the voltage at which the memory cell transistor MT turns on changes. For example, if the state where the threshold voltage is high is defined as data "0" and the state where the threshold voltage is low is defined as data "1", the memory cell can store 1-bit data of "0" and "1".

The charge storage layer 16 contains silicon (Si) and nitrogen (N). The charge storage layer 16 contains or does not contain fluorine (F). The charge storage layer 16 includes a second region. The second region is at least a part of the charge storage layer 16.

The charge storage layer 16 contains, for example, silicon nitride. The thickness of the charge storage layer 16 is, for example, 3 nm or more and 10 nm or less.

The block insulating layer 18 is provided between the tunnel insulating layer 14 and the word lines WL. The block insulating layer 18 is provided between the charge storage layer 16 and the word lines WL. The block insulating layer 18 has a function of blocking a current flowing between the charge storage layer 16 and the word lines WL.

The block insulating layer 18 is, for example, oxide, oxynitride, or nitride. The block insulating layer 18 contains, for example silicon oxide or aluminum oxide.

The core insulating region 20 is provided in the stacked body 30. The core insulating region 20 extends in the z direction. The core insulating region 20 is provided so as to penetrate the stacked body 30. The core insulating region 20 is surrounded by the semiconductor layer 10. The core insulating region 20 is surrounded by the plurality of word lines WL. The core insulating region 20 has a columnar shape. The core insulating region 20 has, for example, a cylindrical shape.

The core insulating region 20 is, for example, oxide, oxynitride, or nitride. The core insulating region 20 is, for example, silicon oxide. The core insulating region 20 contains, for example, fluorine (F).

A second atomic ratio (N/Si) of nitrogen (N) to silicon (Si) in a second region of the charge storage layer 16 is higher that a first atomic ratio (N/Si) of nitrogen (N) to silicon (Si) in the first region of the tunnel insulating layer 14.

The first atomic ratio (N/Si) is, for example, 1.25 or less. The second atomic ratio (N/Si) is, for example, more than 1.25.

When silicon nitride has a stoichiometric composition (stoichiometry), that is, when silicon nitride has a composition of $Si_3N_4$, the atomic ratio (N/Si) of nitrogen (N) to silicon (Si) is 1.33.

Figure 4:
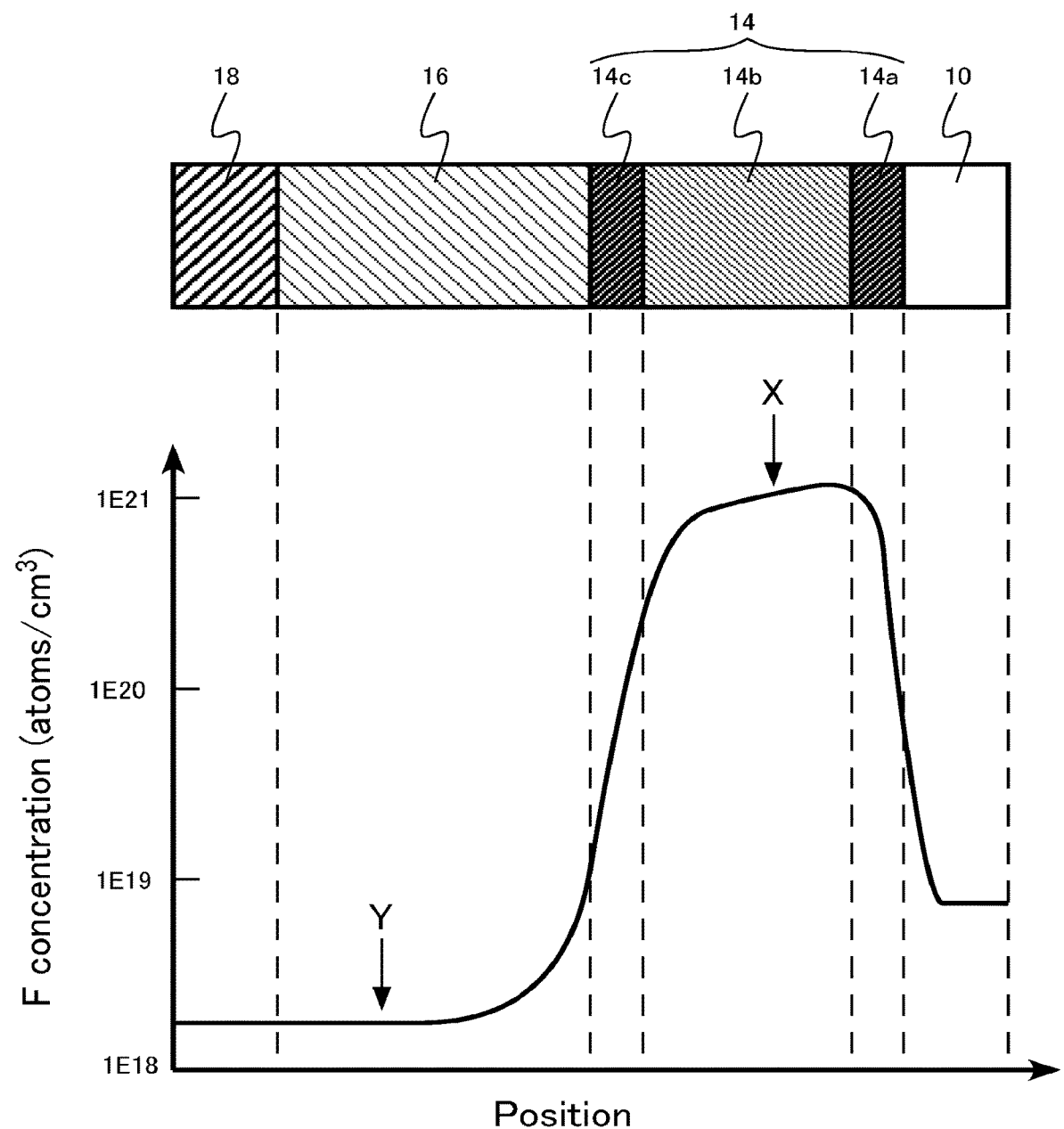
FIG. 4 is a diagram showing a distribution of a fluorine concentration in the semiconductor memory device according to the first embodiment.

FIG. 4 is a diagram showing a distribution of a fluorine concentration in the semiconductor memory device according to the first embodiment. FIG. 4 shows an example of a distribution of the fluorine concentration of the semiconductor layer 10, the tunnel insulating layer 14, the charge storage layer 16, and the block insulating layer 18.

A first fluorine concentration in the first region of the tunnel insulating layer 14 is higher than a second fluorine concentration in the second region of the charge storage layer 16. The first fluorine concentration in the first region is, for example, $2 \times 10^{20}$ atoms/cm$^3$ or more. The second fluorine concentration in the second region is, for example, $1 \times 10^{20}$ atoms/cm$^3$ or less.

The region X in FIG. 4 is an example of the first region, and the region Y is an example of the second region.

The second atomic ratio (N/Si) of nitrogen (N) to silicon (Si) in the region Y is higher than the first atomic ratio (N/Si) of nitrogen (N) to silicon (Si) in the region X.

Next, an example of a manufacturing method of the semiconductor memory device according to the first embodiment will be described. A manufacturing method of a semiconductor memory device according to the first embodiment includes: forming a stacked body in which a plurality of first layers and a plurality of second layers are alternately stacked in a first direction; forming an opening penetrating the stacked body and extending in the first direction; forming a first insulating film on an inner wall of the opening; forming a second insulating film containing silicon (Si) and nitrogen (N) on the first insulating film; forming a third insulating film containing silicon (Si) and nitrogen (N) on the second insulating film, the third insulating film having an atomic ratio (N/Si) of nitrogen (N) to silicon (Si) lower than an atomic ratio (N/Si) of nitrogen (N) to silicon (Si) in the second insulating film; forming a semiconductor film on the third insulating film; and introducing fluorine (F) into the third insulating film.

FIG. 5, FIG. 6, FIG. 7, FIG. 8, FIG. 9, FIG. 10, FIG. 11, FIG. 12, FIG. 13, and FIG. 14 are schematic cross-sectional views showing the manufacturing method for the semiconductor memory device according to the first embodiment. FIG. 5, FIG. 6, FIG. 7, FIG. 8, FIG. 9, FIG. 10, FIG. 11, FIG. 12, FIG. 13, and FIG. 14 respectively show cross sections corresponding to FIG. 2A. FIG. 5, FIG. 6, FIG. 7, FIG. 8, FIG. 9, FIG. 10, FIG. 11, FIG. 12, FIG. 13, and FIG. 14 are views showing an example of a manufacturing method for the memory cell array 100 of the semiconductor memory device.

Figure 5:
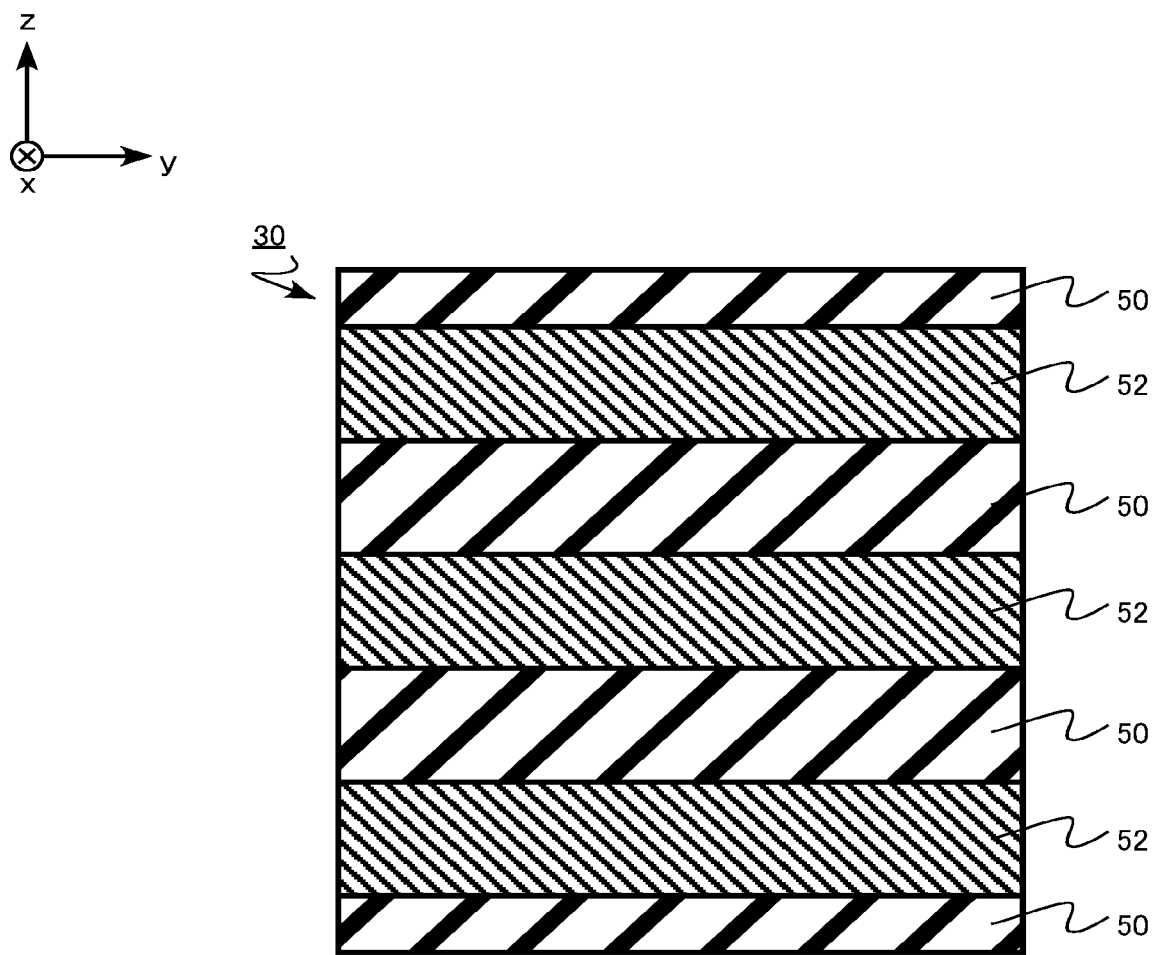
FIG. 5 is a schematic cross-sectional view showing a manufacturing method for the semiconductor memory device according to the first embodiment.

First, silicon oxide layers 50 and silicon nitride layers 52 are alternately stacked on a semiconductor substrate (not shown) (FIG. 5). The stacked body 30 in which the plurality of silicon oxide layers 50 and the plurality of silicon nitride layers 52 are alternately stacked in the z direction is formed. The silicon oxide layer 50 is an example of the first layer, and the silicon nitride layer 52 is an example of the second layer. The first layer and the second layer are, for example, insulators made of different materials.

The silicon oxide layer 50 and the silicon nitride layer 52 are formed by, for example, the Chemical Vapor Deposition method (CVD method). A part of the silicon oxide layer 50 finally becomes the interlayer insulating layer 12.

Figure 6:
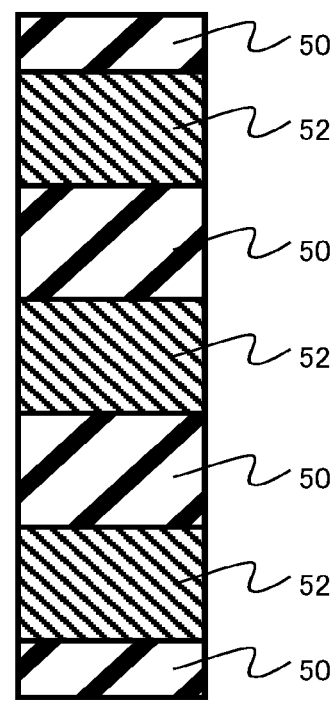
FIG. 6 is a schematic cross-sectional view showing the manufacturing method for the semiconductor memory device according to the first embodiment.

Next, a memory hole 54 is formed in the silicon oxide layers 50 and the silicon nitride layers 52 (FIG. 6). The memory hole 54 penetrates the stacked body 30 and extends in the z direction. The memory hole 54 is formed by, for example, the lithography method and the Reactive Ion Etching method (RIE method). The memory hole 54 is an example of the opening.

Figure 7:
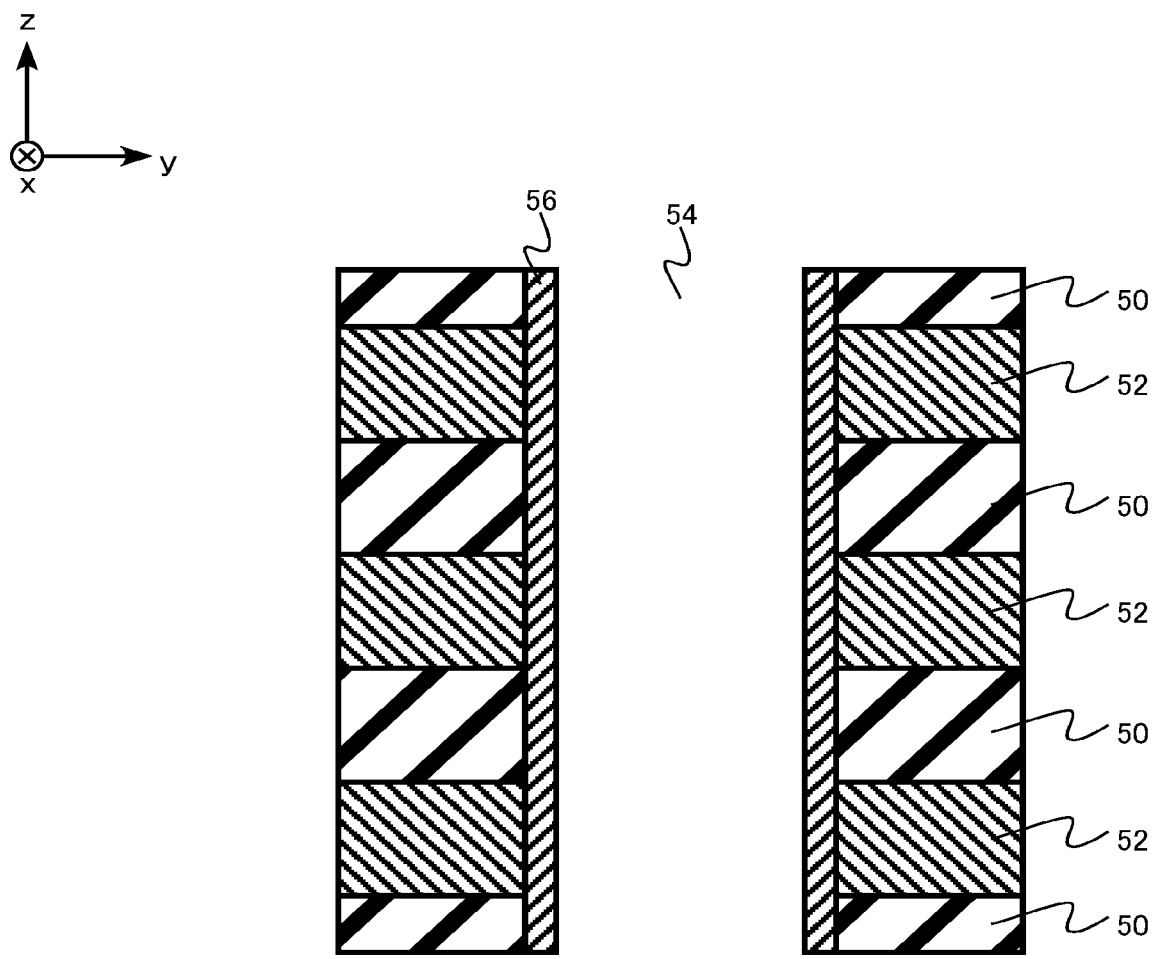
FIG. 7 is a schematic cross-sectional view showing the manufacturing method for the semiconductor memory device according to the first embodiment.

Next, a silicon oxide film 56 is formed on the inner wall of the memory hole 54 (FIG. 7). The silicon oxide film 56 is formed by, for example, the CVD method. The silicon oxide film 56 is an example of the first insulating film. The silicon oxide film 56 finally becomes the block insulating layer 18.

Figure 8:
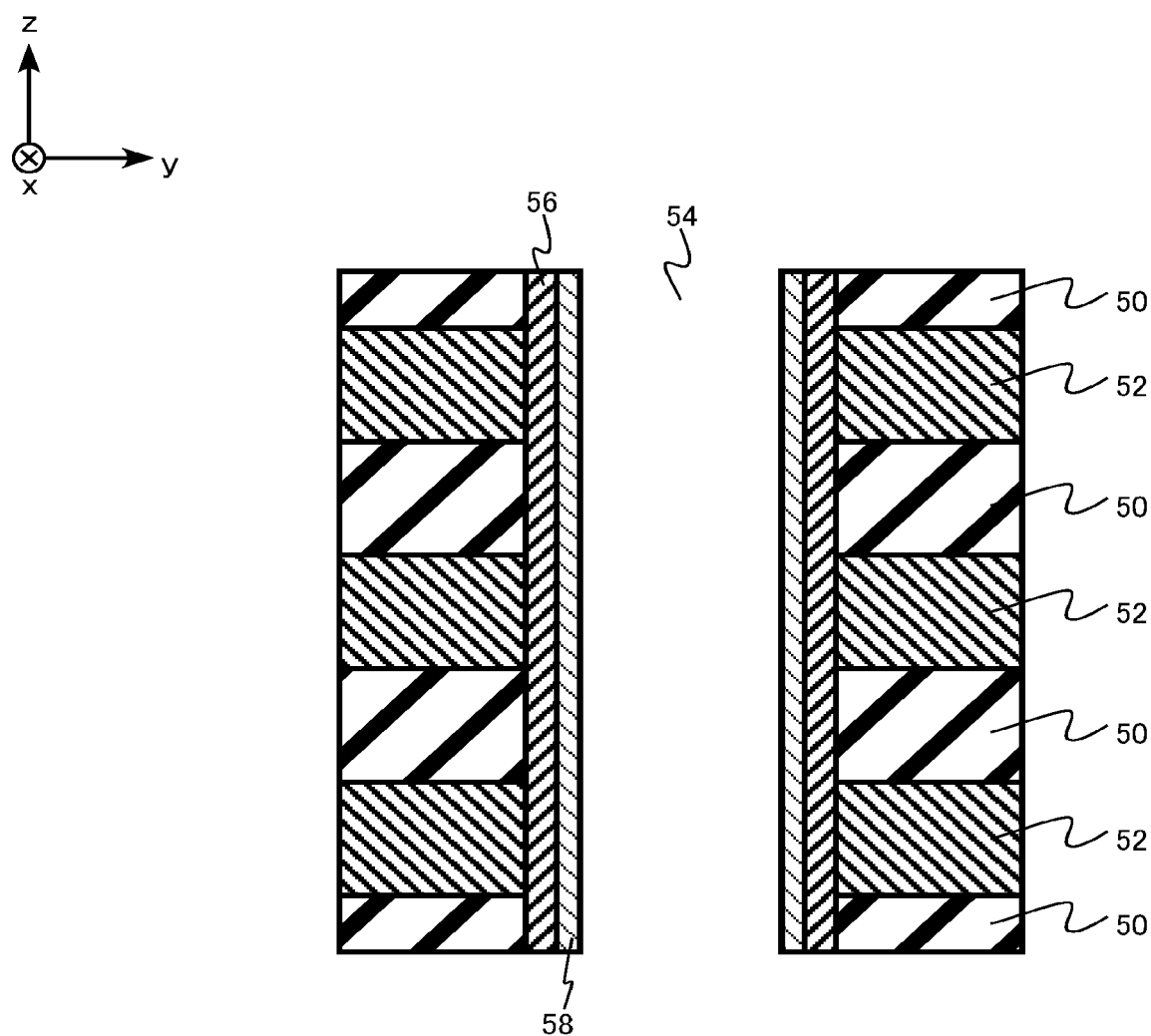
FIG. 8 is a schematic cross-sectional view showing the manufacturing method for the semiconductor memory device according to the first embodiment.

Next, a silicon nitride film 58 is formed on the silicon oxide film 56 (FIG. 8). The silicon nitride film 58 is formed by, for example, the CVD method. The silicon nitride film 58 is an example of the second insulating film. The silicon nitride film 58 finally becomes the charge storage layer 16.

Figure 9:
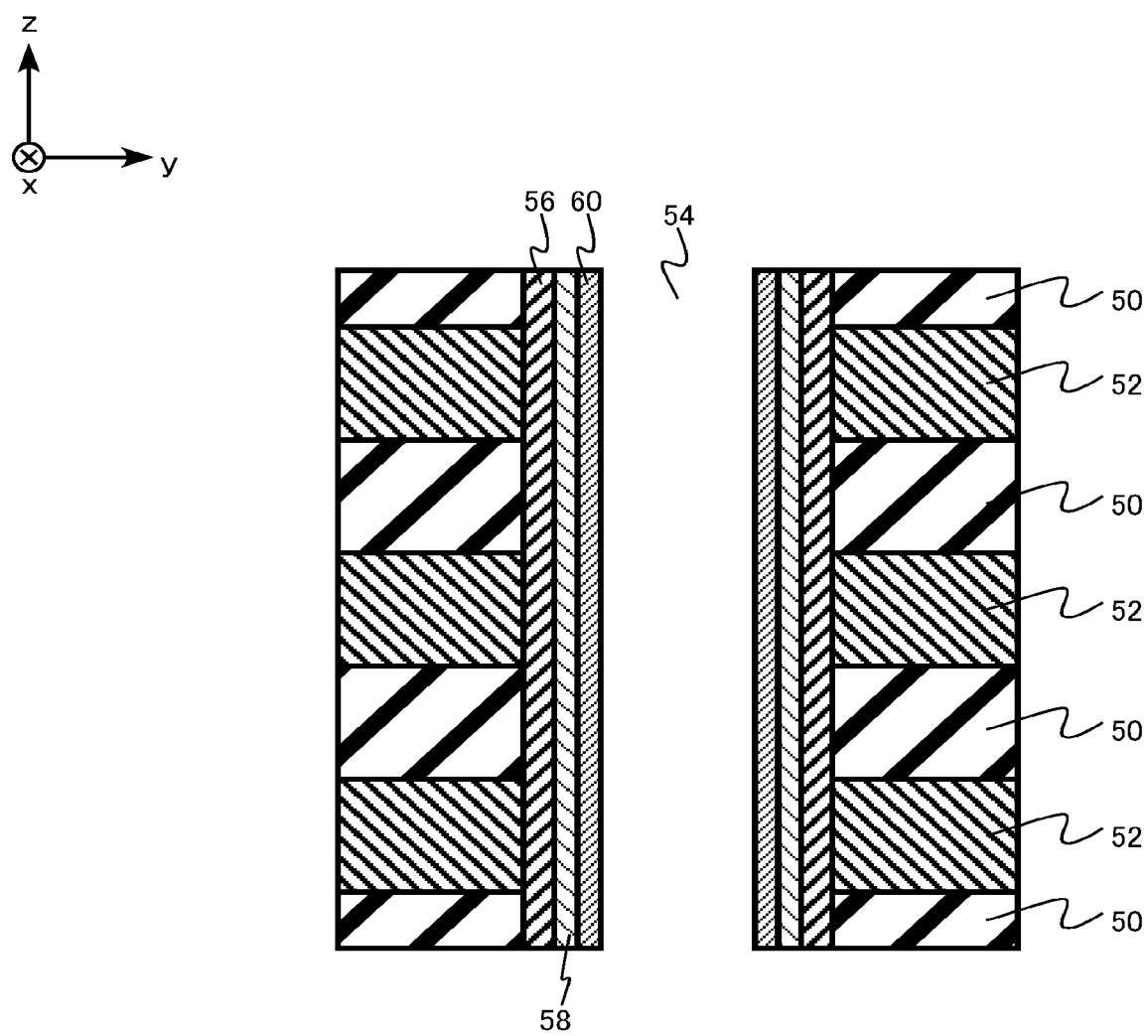
FIG. 9 is a schematic cross-sectional view showing the manufacturing method for the semiconductor memory device according to the first embodiment.

Next, a stacked insulating film 60 is formed on the silicon nitride film 58 (FIG. 9). The stacked insulating film 60 is, for example, a stacked film of a silicon oxide film, a silicon nitride film, and a silicon oxide film.

The stacked insulating film 60 has an atomic ratio (N/Si) lower than an atomic ratio (N/Si) of nitrogen (N) to silicon (Si) of the silicon nitride film 58. The silicon nitride film in the stacked insulating film 60 has a lower atomic ratio (N/Si) of nitrogen (N) to silicon (Si) than the silicon nitride film 58. In other words, the silicon nitride film 58 has a higher atomic ratio (N/Si) of nitrogen (N) to silicon (Si) than the silicon nitride film in the stacked insulating film 60.

The stacked insulating film 60 is formed by, for example, the CVD method. The stacked insulating film 60 is an example of the third insulating film. The stacked insulating film 60 finally becomes the tunnel insulating layer 14.

Figure 10:
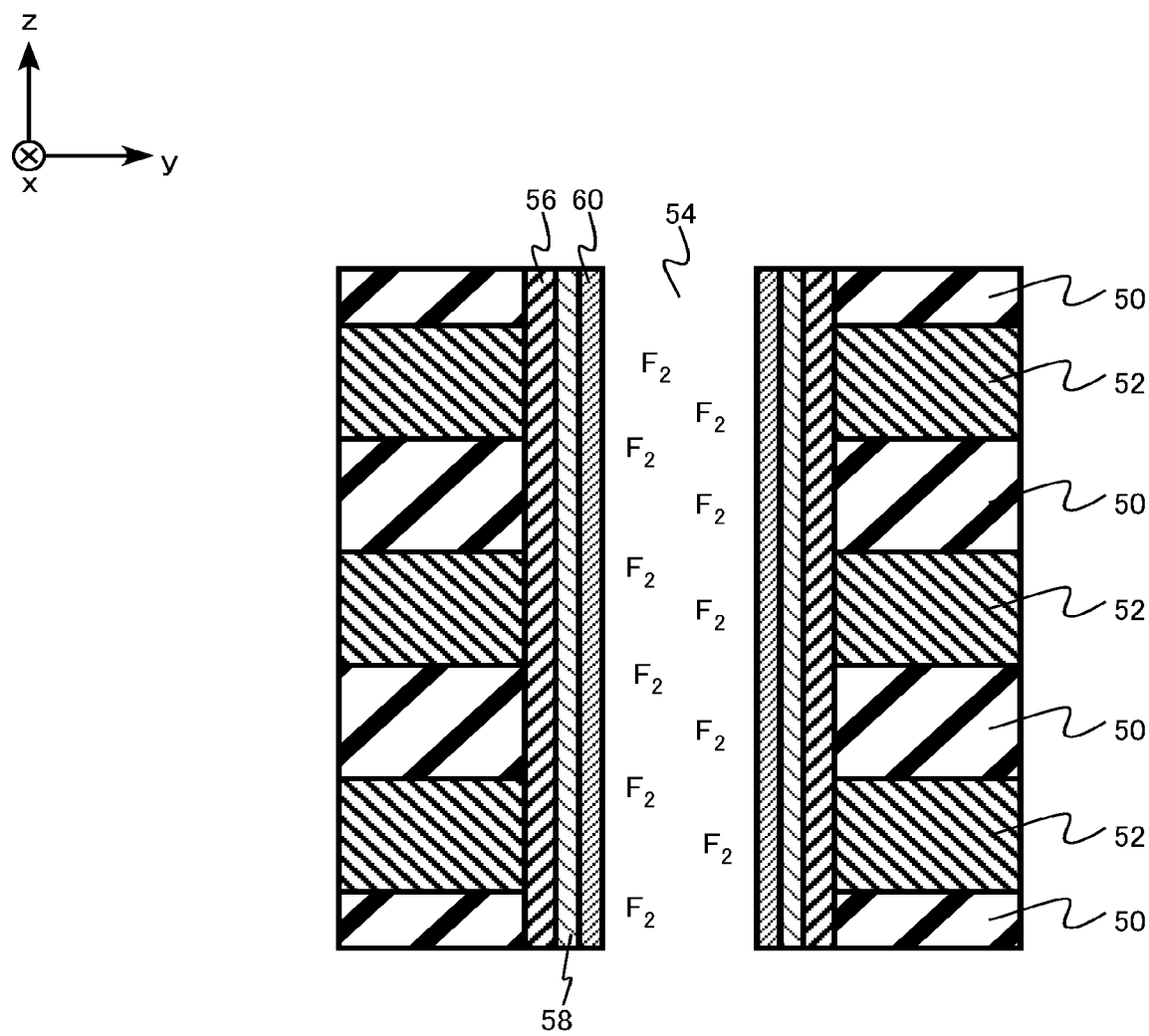
FIG. 10 is a schematic cross-sectional view showing the manufacturing method for the semiconductor memory device according to the first embodiment.

Next, heat treatment is performed in an atmosphere containing fluorine (F) (FIG. 10). The heat treatment in an atmosphere containing fluorine (F) is, for example, heat treatment in an atmosphere containing fluorine gas ($F_2$) or nitrogen trifluoride gas ($NF_3$).

By this heat treatment, fluorine is introduced into the stacked insulating film 60. By this heat treatment, the fluorine concentration of the stacked insulating film 60 becomes higher than the fluorine concentration of the silicon nitride film 58. The fluorine concentration of the stacked insulating film 60 is, for example, $2 \times 10^{20}$ atoms/cm$^3$ or more. On the other hand, the fluorine concentration of the silicon nitride film 58 is, for example, $1 \times 10^{20}$ atoms$^{-3}$ or less.

Figure 11:
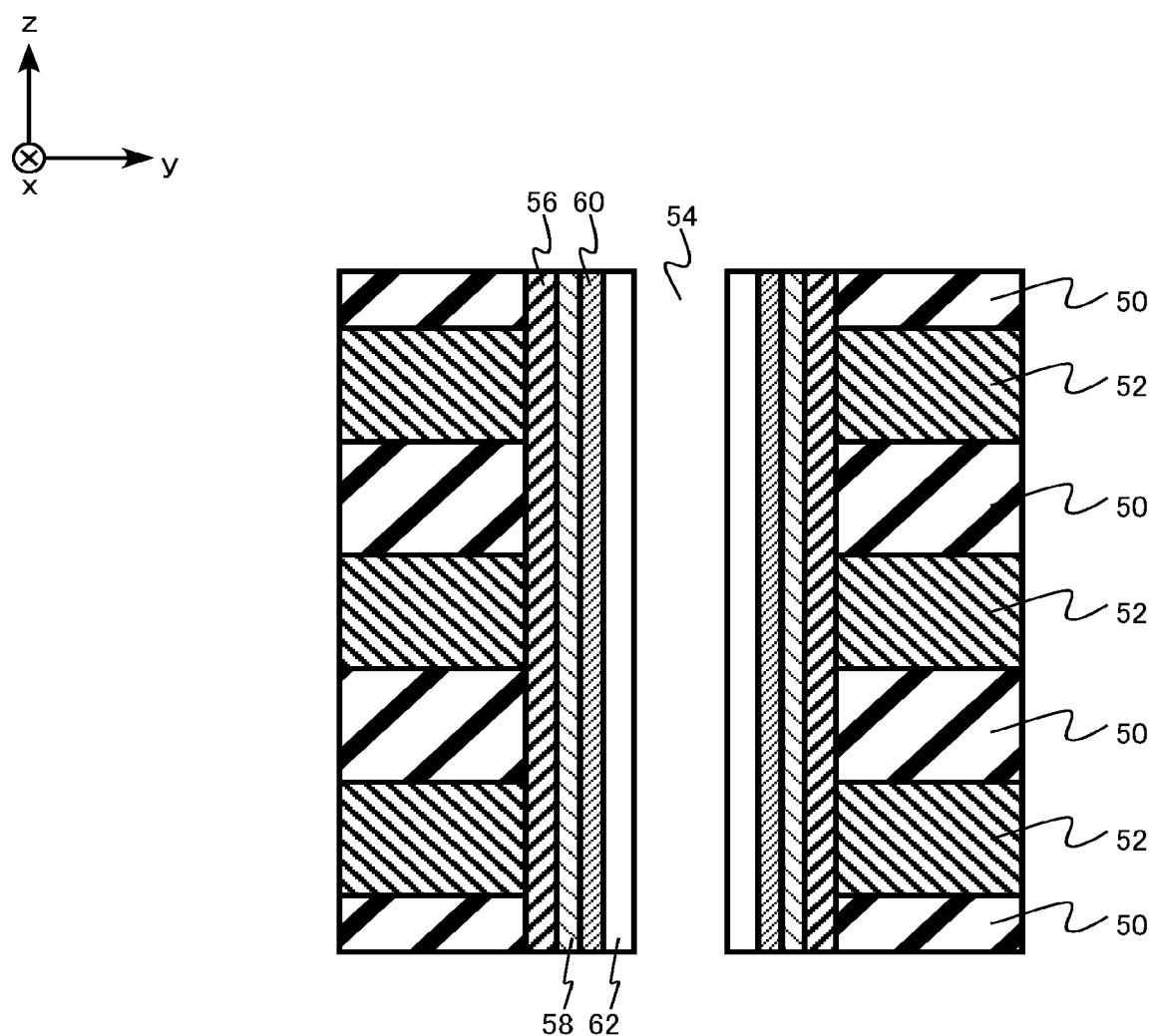
FIG. 11 is a schematic cross-sectional view showing the manufacturing method for the semiconductor memory device according to the first embodiment.

Next, a polycrystalline silicon film 62 is formed on the stacked insulating film 60 (FIG. 11). The polycrystalline silicon film 62 is formed by, for example, the CVD method. The polycrystalline silicon film 62 is an example of the semiconductor film. The polycrystalline silicon film 62 finally becomes the semiconductor layer 10.

Figure 12:
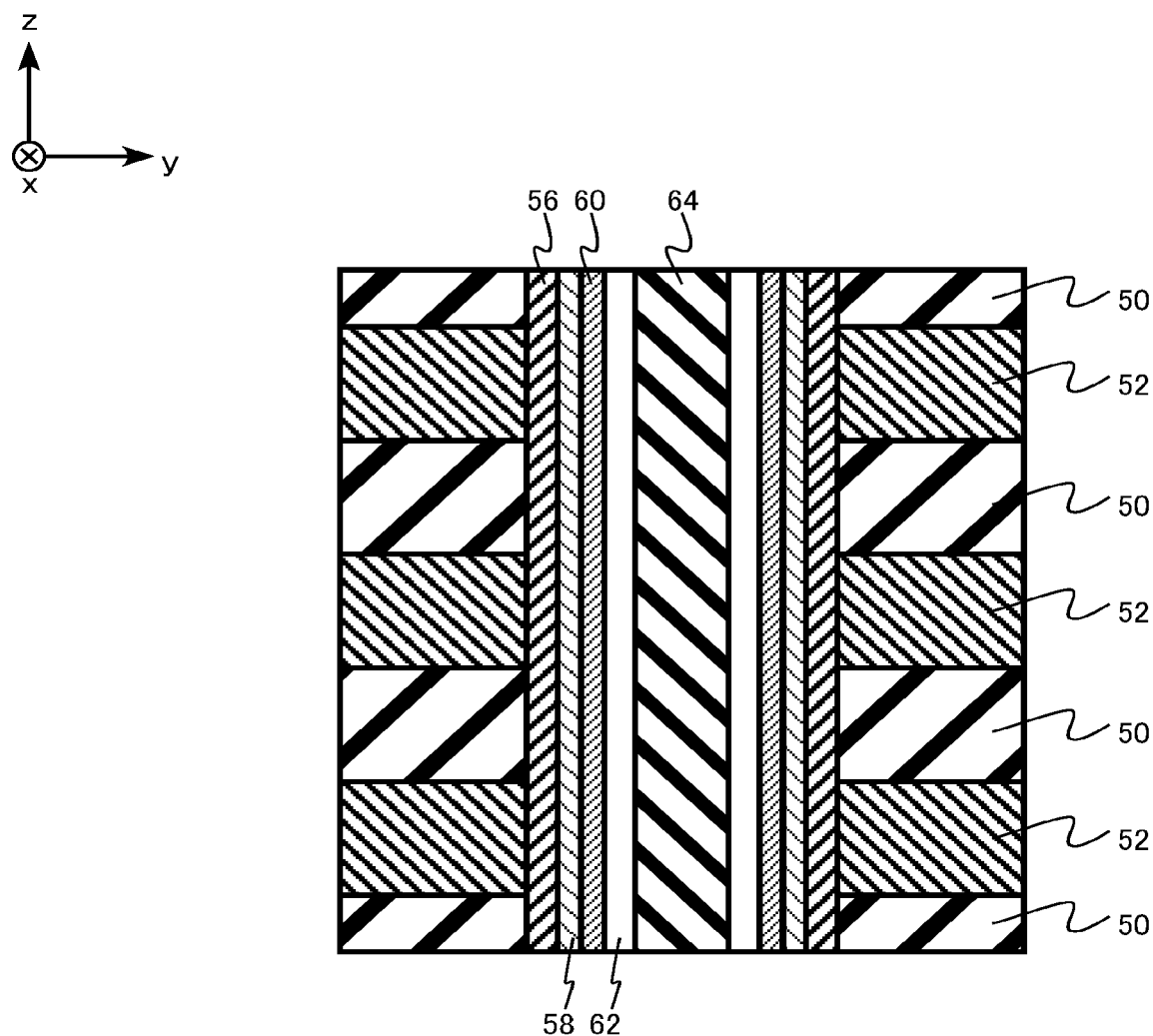
FIG. 12 is a schematic cross-sectional view showing the manufacturing method for the semiconductor memory device according to the first embodiment.

Next, the memory hole 54 is filled with a silicon oxide film 64 (FIG. 12). The silicon oxide film 64 is formed on the polycrystalline silicon film 62. The silicon oxide film 64 is formed by, for example, the CVD method. The silicon oxide film 64 is an example of the fourth insulating film. The silicon oxide film 64 finally becomes the core insulating region 20.

Figure 13:
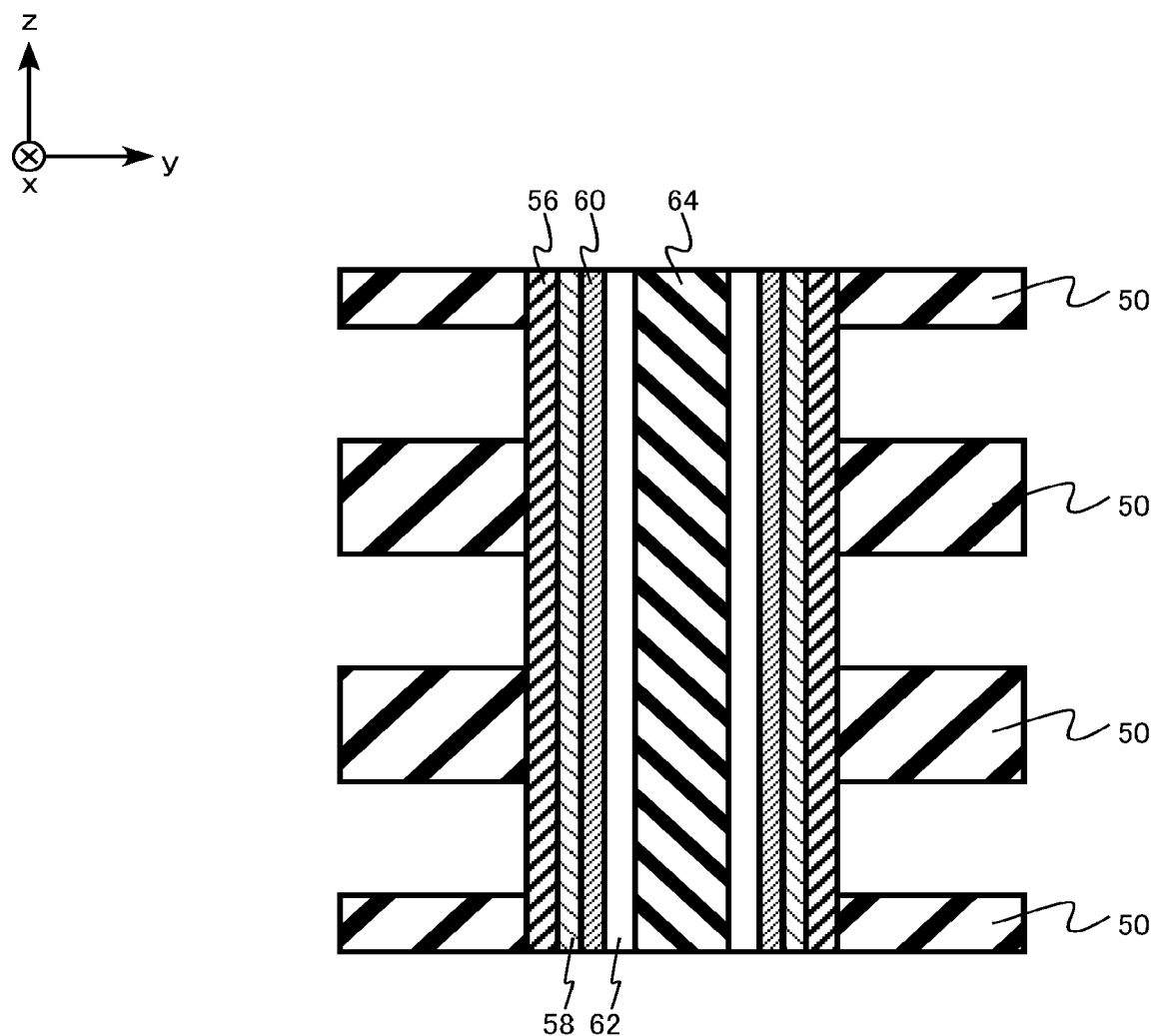
FIG. 13 is a schematic cross-sectional view showing the manufacturing method for the semiconductor memory device according to the first embodiment.

Next, the silicon nitride layers 52 are selectively removed by wet etching using etching grooves (not shown) (FIG. 13). For the wet etching, for example, a phosphoric acid solution is used to selectively etch the silicon nitride layers 52 with respect to the silicon oxide layers 50 and the silicon oxide film 56.

Figure 14:
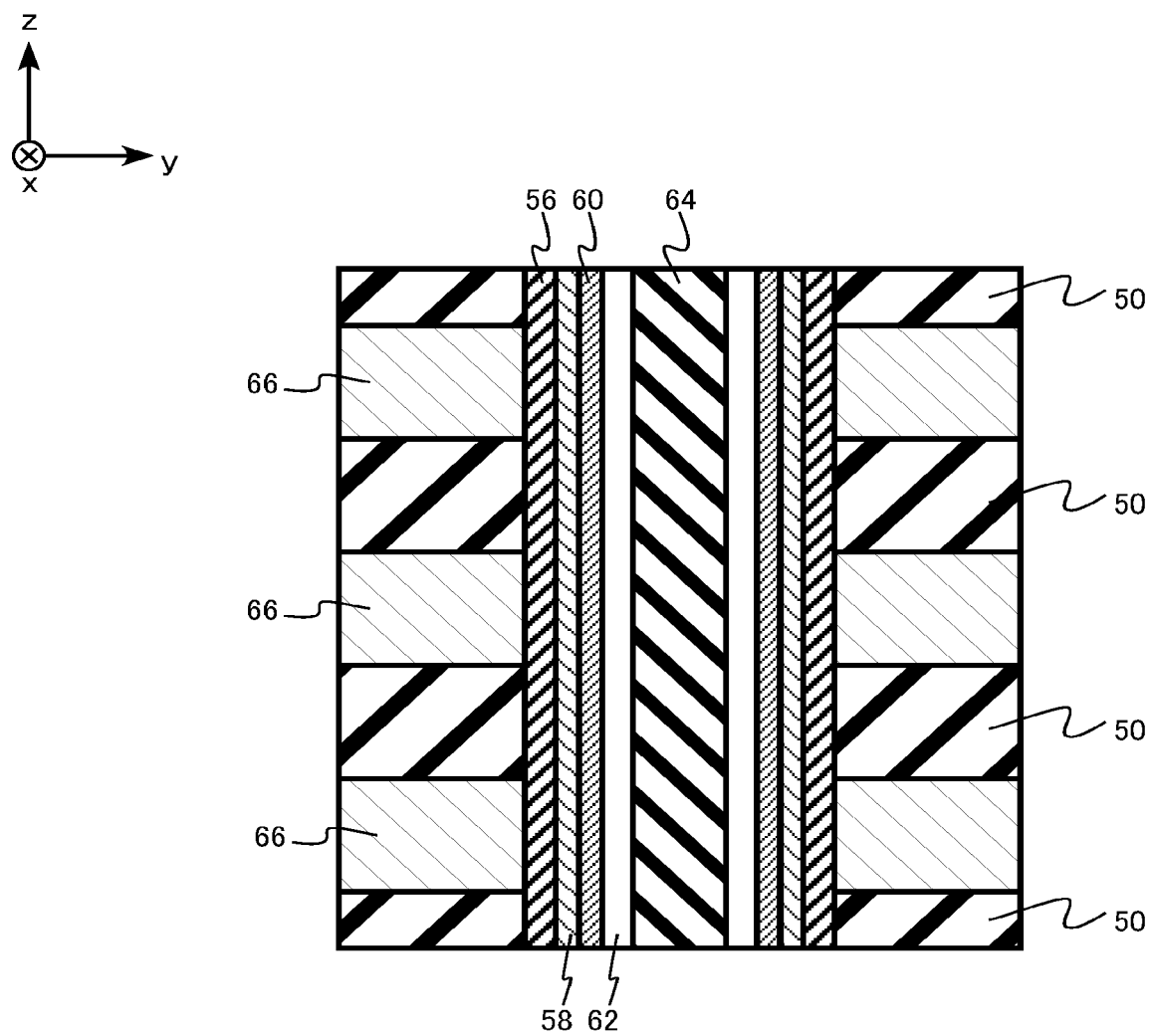
FIG. 14 is a schematic cross-sectional view showing the manufacturing method for the semiconductor memory device according to the first embodiment.

Next, tungsten films 66 are formed in the regions where the silicon nitride layers 52 are removed (FIG. 14). The tungsten film 66 is formed by, for example, the CVD method. The tungsten film 66 is an example of the conductive film.

The tungsten film 66 finally becomes the word line WL. It is possible to form a barrier metal film such as a titanium nitride film before forming the tungsten film 66.

The memory cell array 100 of the semiconductor memory device according to the first embodiment is manufactured by the above manufacturing method.

It is also possible to perform heat treatment in an atmosphere containing fluorine (F) after forming the polycrystalline silicon film 62 on the stacked insulating film 60. In this case, fluorine is introduced into the polycrystalline silicon film 62 and the stacked insulating film 60.

Further, it is also possible to form, after forming the polycrystalline silicon film 62 on the stacked insulating film 60, a silicon oxide film 64 containing fluorine on the polycrystalline silicon film 62, and to perform heat treatment to introduce fluorine into the stacked insulating film 60 from the silicon oxide film 64.

In this case, fluorine is introduced into the polycrystalline silicon film 62 and the stacked insulating film 60. Fluorine may or may not remain in the silicon oxide film 64 finally.

Further, although the case where both the first layer and the second layer at the time of forming the stacked body 30 are insulators has been described as an example, for example, the second layer may be a conductor. In this case, the second layer itself can be the word line WL.

Next, the functions and effects of the semiconductor memory device according to the first embodiment will be described.

The three-dimensional NAND flash memory has a failure mode due to a short charge retention time of a memory cell and poor charge retention characteristics. For example, there is an initial failure that after data is written in a memory cell, the data is destroyed in the next reading although the data can be retained until the verify reading. And, for example, there is a data retention failure in which data is destroyed in a short time of the order of milliseconds. Any of the failures is a failure caused by the short charge retention time of the failed memory cell.

In the semiconductor memory device according to the first embodiment, the tunnel insulating layer 14 contains fluorine. The tunnel insulating layer 14 containing fluorine reduces memory cells having a short charge retention time. Therefore, initial failures and short-term data retention failures are reduced. The details will be described below.

Figure 15A:
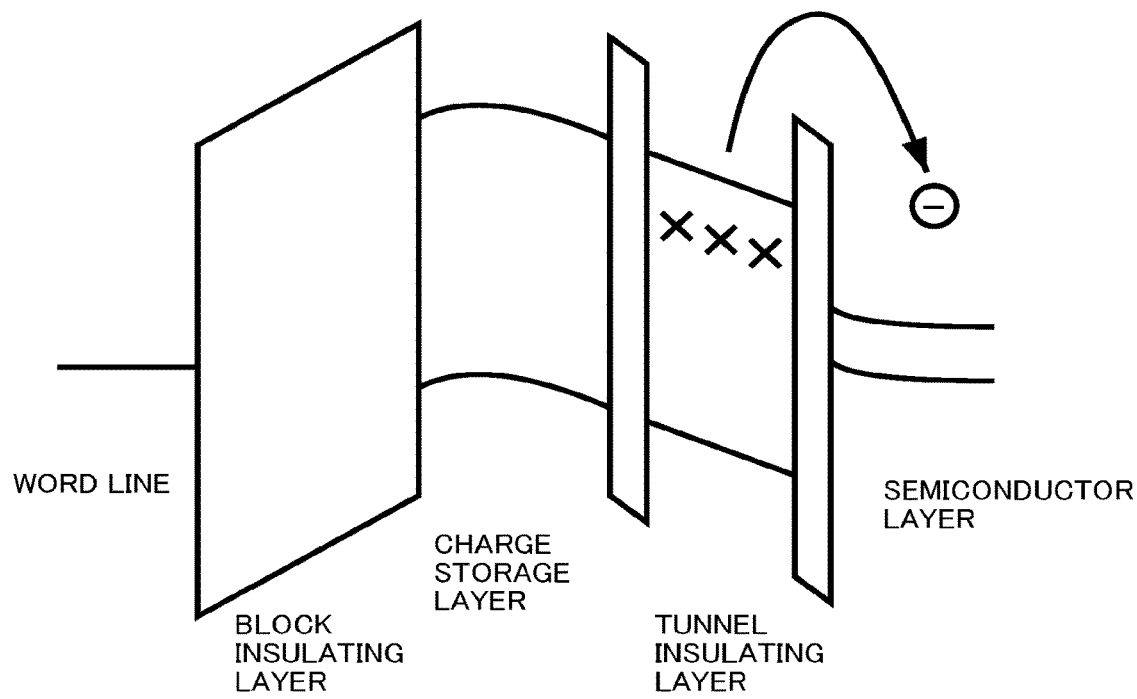
FIGS. 15A and 15B are explanatory diagrams of functions and effects of the semiconductor memory device according to the first embodiment.
Figure 15B:
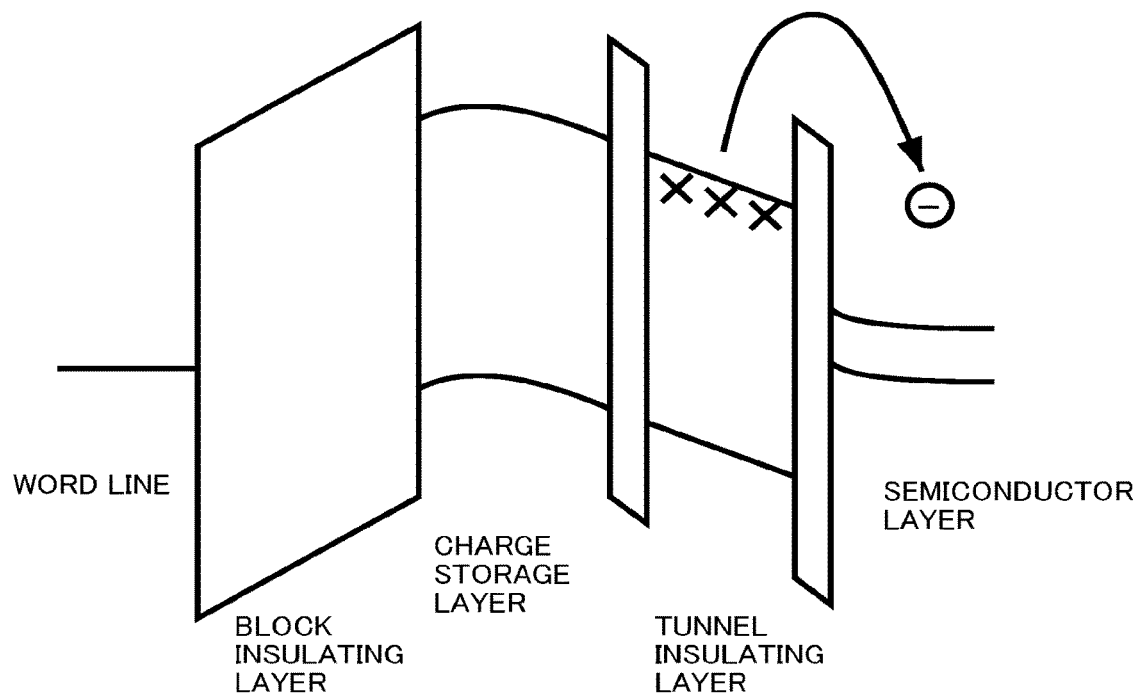

FIGS. 15A and 15B are explanatory diagrams of the functions and effects of the semiconductor memory device according to the first embodiment. FIGS. 15A and 15B are band diagrams of memory cells. FIG. 15A is a band diagram of the memory cell of the comparative example, and FIG. 15B is a band diagram of the memory cell of the first embodiment. The cross marks in the band gap of the tunnel insulating layer in FIGS. 15A and 15B indicate the trap levels in the band gap.

As shown in FIG. 15A, it is considered that a shallow trap levels exist in the tunnel insulating layer in the memory cell having a short charge retention time. Then, it is considered that the electrons trapped in this shallow trap levels are detrapped in a short time, which causes an initial failure and a short-term data retention failure.

As shown in FIG. 15B, in the first embodiment, the tunnel insulating layer contains fluorine, so that the shallow trap levels that cause a failure is changed to extremely shallow trap levels. By further shallowing the depth of the shallow trap levels that cause a failure, it becomes possible to extremely shorten the time until the electrons are detrapped.

Therefore, for example, electron detrapping occurs between the writing of data in the memory cell and the verify reading. Therefore, the state is apparently similar to the case where there is no shallow trap level in the band gap. Therefore, initial failures and short-term data retention failures are reduced.

Figure 16:
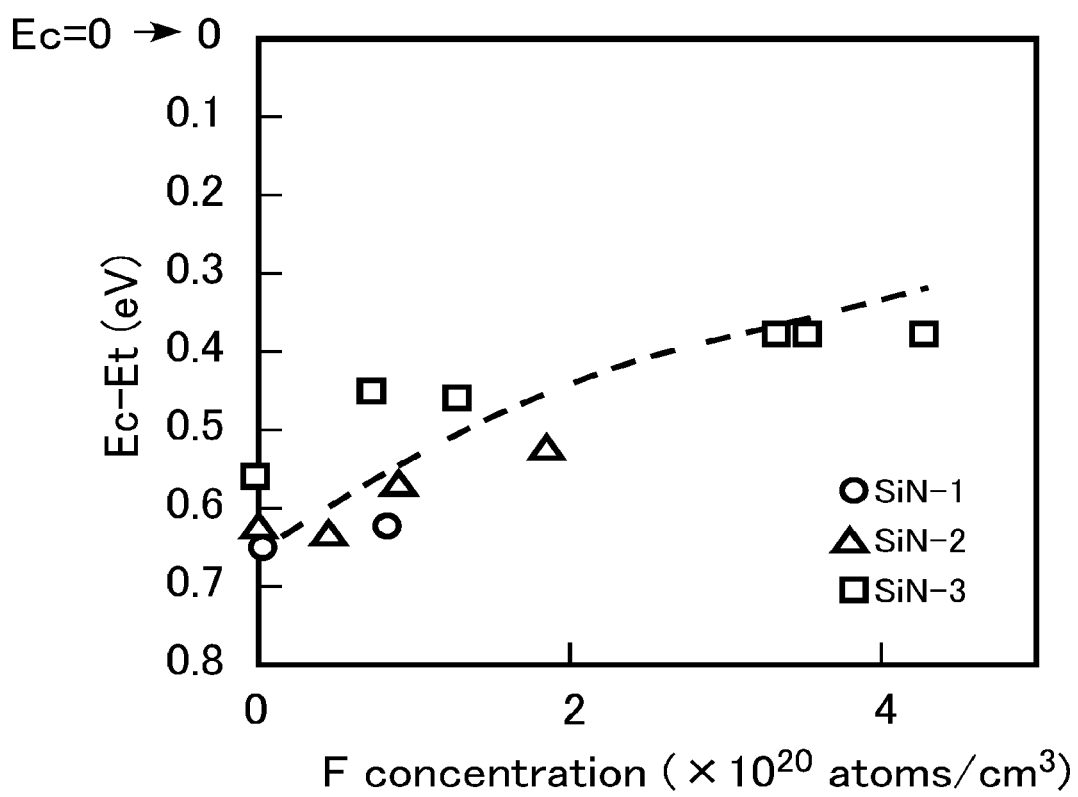
FIG. 16 is an explanatory diagram of the functions and effects of the semiconductor memory device according to the first embodiment.

FIG. 16 is an explanatory diagram of the functions and effects of the semiconductor memory device according to the first embodiment. FIG. 16 is a diagram showing the relationship between the fluorine concentration in the silicon nitride film and the depth of the trap levels existing in the band gap of the silicon nitride film.

The horizontal axis of FIG. 16 represents the fluorine concentration, and the vertical axis of FIG. 16 represents the depth of the trap levels from the bottom of the conduction band. The samples having different atomic ratios (N/Si) of nitrogen (N) to silicon (Si) in the silicon nitride film are evaluated. The atomic ratio (N/Si) decreases in the order of SiN-1, SiN-2, and SiN-3. For example, SiN-3 has a smaller proportion of nitrogen (N) and a larger proportion of silicon (Si) than SiN-1.

As is clear from FIG. 16, as the fluorine concentration in the silicon nitride film increases, the shallow trap levels with a depth of about 0.6 eV become even shallower to about 0.4 eV. The change in the trap level depth does not depend on the atomic ratio (N/Si) in the silicon nitride film.

Therefore, as in the memory cell of the first embodiment, the tunnel insulating layer 14 containing fluorine changes the shallow trap levels to extremely shallow trap levels. Therefore, initial failures and short-term data retention failures are reduced.

If the trap levels existing in the charge storage layer 16 that contribute to charge retention become shallow, the charge retention characteristics may degrade. In the memory cell of the first embodiment, the tunnel insulating layer 14 has a higher fluorine concentration than the charge storage layer 16. In other words, the fluorine concentration of the charge storage layer 16 is lower than the fluorine concentration of the tunnel insulating layer 14.

In the memory cell of the first embodiment, by reducing the fluorine concentration of the charge storage layer 16, it is possible to prevent the trap levels existing in the charge storage layer 16 that contribute to charge retention from becoming shallow.

With the semiconductor memory device and the manufacturing method therefor according to the first embodiment, it is possible to easily realize a structure in which the tunnel insulating layer 14 has a high fluorine concentration and the charge storage layer 16 has a low fluorine concentration.

Figure 17:
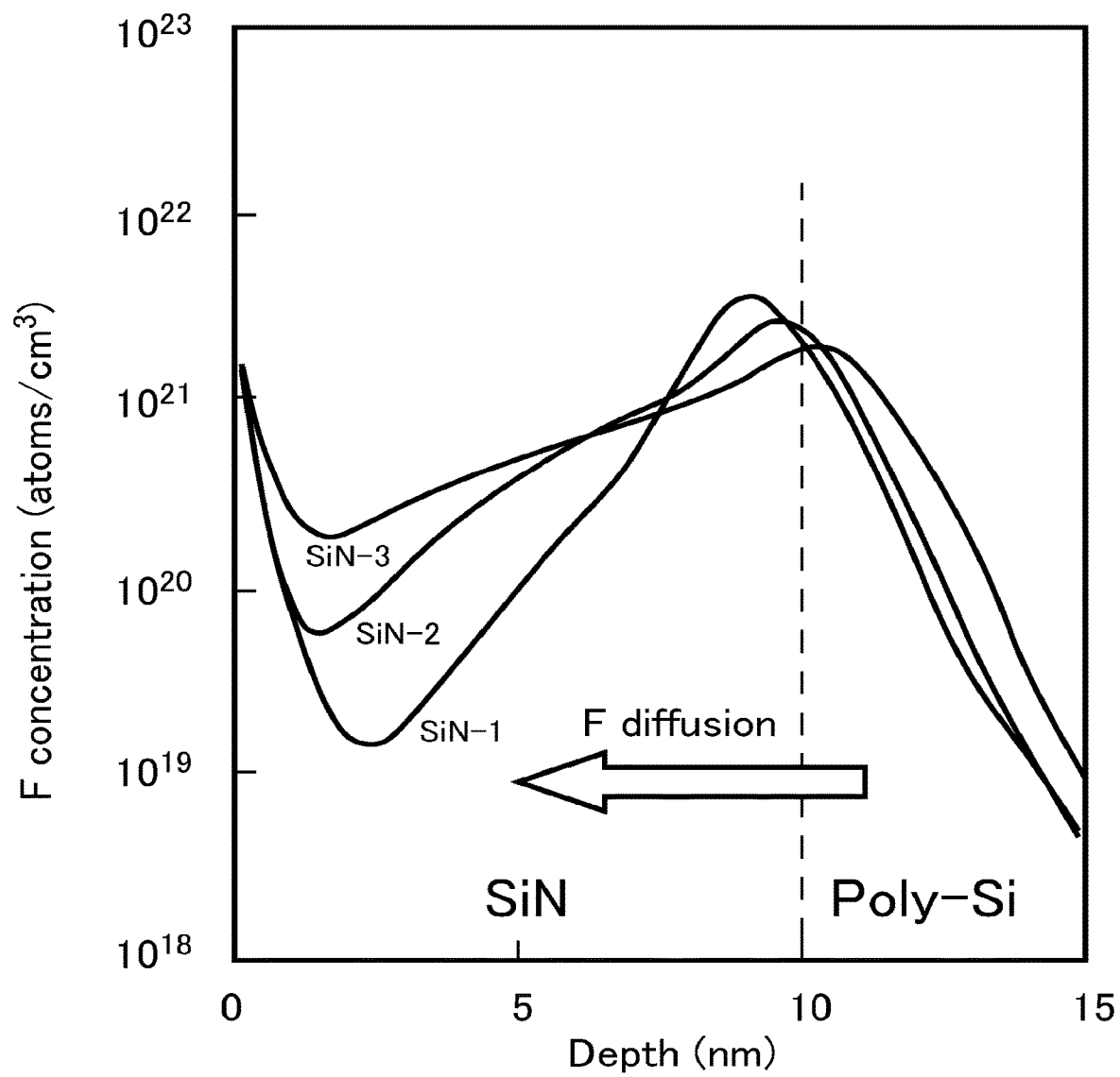
FIG. 17 is an explanatory diagram of functions and effects of the semiconductor memory device and the manufacturing method therefor according to the first embodiment.

FIG. 17 is an explanatory diagram of functions and effects of the semiconductor memory device and the manufacturing method according to the first embodiment. FIG. 17 shows a fluorine concentration distribution when fluorine is thermally diffused from a fluorine-containing polycrystalline silicon film (Poly-Si) to a silicon nitride film in contact with the polycrystalline silicon film.

The horizontal axis of FIG. 17 represents the depth with respect to the interface between the silicon nitride film and the substrate, and the vertical axis of FIG. 17 represents the fluorine concentration. The samples having different atomic ratios (N/Si) of nitrogen (N) to silicon (Si) in the silicon nitride film are evaluated. The atomic ratio (N/Si) decreases in the order of SiN-1, SiN-2, and SiN-3. For example, SiN-3 has a smaller proportion of nitrogen (N) and a larger proportion of silicon (Si) than SiN-1.

As is clear from FIG. 17, the larger the proportion of silicon (Si) in the silicon nitride film, the faster the diffusion of fluorine in the silicon nitride film.

In the first embodiment, the atomic ratio (N/Si) in the tunnel insulating layer 14 is made smaller than the atomic ratio (N/Si) in the charge storage layer 16. That is, the ratio of silicon (Si) in the tunnel insulating layer 14 is made larger than the ratio of silicon (Si) in the charge storage layer 16. Then, after the tunnel insulating layer 14 is formed, fluorine is diffused into the tunnel insulating layer 14 from the side opposite to the charge storage layer 16.

Therefore, in the tunnel insulating layer 14 in which the proportion of silicon (Si) is large and the diffusion of fluorine is fast, the fluorine concentration becomes high as shown in FIG. 4. On the other hand, in the charge storage layer 16 in which the proportion of silicon (Si) is small and the diffusion of fluorine is slow, the fluorine concentration is kept low as shown in FIG. 4.

From the viewpoint of making the trap levels of the tunnel insulating layer 14 shallow, the first fluorine concentration in the first region of the tunnel insulating layer 14 is preferably $2 \times 10^{20}$ atoms/cm$^3$ or more, and more preferably $5 \times 10^{20}$ atoms/cm$^3$ or more.

From the viewpoint of suppressing the trap levels of the charge storage layer 16 from becoming shallow, the second fluorine concentration in the second region of the charge storage layer 16 is preferably $1 \times 10^{20}$ atoms/cm$^3$ or less, more preferably $5 \times 10^{19}$ atoms/cm$^3$ or less, and even more preferably $1 \times 10^{19}$ atoms/cm$^3$ or less.

From the viewpoint of promoting the diffusion of fluorine in the tunnel insulating layer 14, the first atomic ratio (N/Si) of nitrogen (N) to silicon (Si) in the first region of the tunnel insulating layer 14 is preferably 1.25 or less, and more preferably 1.10 or less.

From the viewpoint of suppressing the diffusion of fluorine in the charge storage layer 16, the atomic ratio (N/Si) of nitrogen (N) to silicon (Si) in the second region of the charge storage layer 16 is preferably more than 1.25, more preferably more than 1.30, and even more preferably more than 1.33.

From the viewpoint of reducing the amount of trap levels of the tunnel insulating layer 14, the tunnel insulating layer 14 preferably contains oxygen (O). The first region of the tunnel insulating layer 14 preferably contains oxygen. The tunnel insulating layer 14 preferably contains silicon oxynitride. The intermediate portion 14b is preferably made of silicon oxynitride.

From the viewpoint of reducing the trap levels of the crystal grain boundary in the semiconductor layer 10 or the interface states between the semiconductor layer 10 and the tunnel insulating layer 14 to improve the characteristics of the memory cell transistor MT, the semiconductor layer 10 preferably contains fluorine. A third fluorine concentration in a third region of the semiconductor layer 10 is preferably higher than the second fluorine concentration in the second region of the charge storage layer 16.

Figure 18:
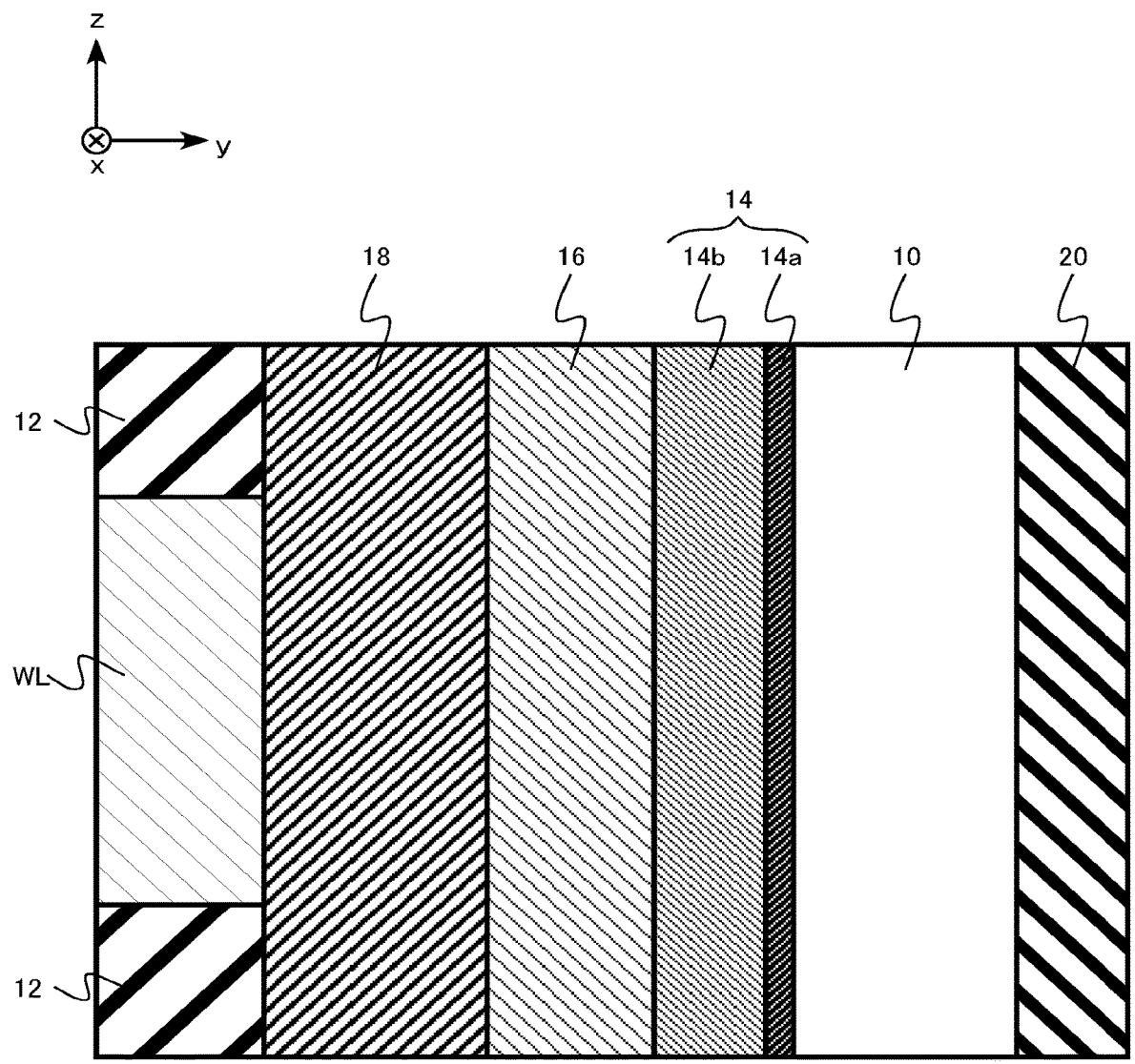
FIG. 18 is a schematic cross-sectional view of a memory cell of a semiconductor memory device of a modified example of the first embodiment.

FIG. 18 is a schematic cross-sectional view of a memory cell of a semiconductor memory device of a modified example of the first embodiment. FIG. 18 is an enlarged cross-sectional view of a part of the memory cell. FIG. 18 is a diagram corresponding to FIG. 3.

The memory cell of the modified example is different from the memory cell of the first embodiment only in that the tunnel insulating layer 14 does not have the upper layer portion 14c. The memory cell of the modified example can also obtain the same functions and effects as the memory cell of the first embodiment.

As described above, according to the first embodiment and the modified example, it is possible to provide a semiconductor memory device capable of improving the charge retention characteristic by making the trap levels in the band gap of the tunnel insulating layer shallow.

Second Embodiment

A semiconductor memory device according to the second embodiment is different from the semiconductor memory device according to the first embodiment in that it is a two-dimensional NAND flash memory. Hereinafter, a part of the description overlapping with that of the first embodiment will be omitted.

The semiconductor memory device according to the second embodiment is a two-dimensional NAND flash memory. A memory cell of the semiconductor memory device according to the second embodiment is a so-called Metal-Oxide-Nitride-Oxide-Semiconductor type (MONOS type) memory cell.

Figure 19:
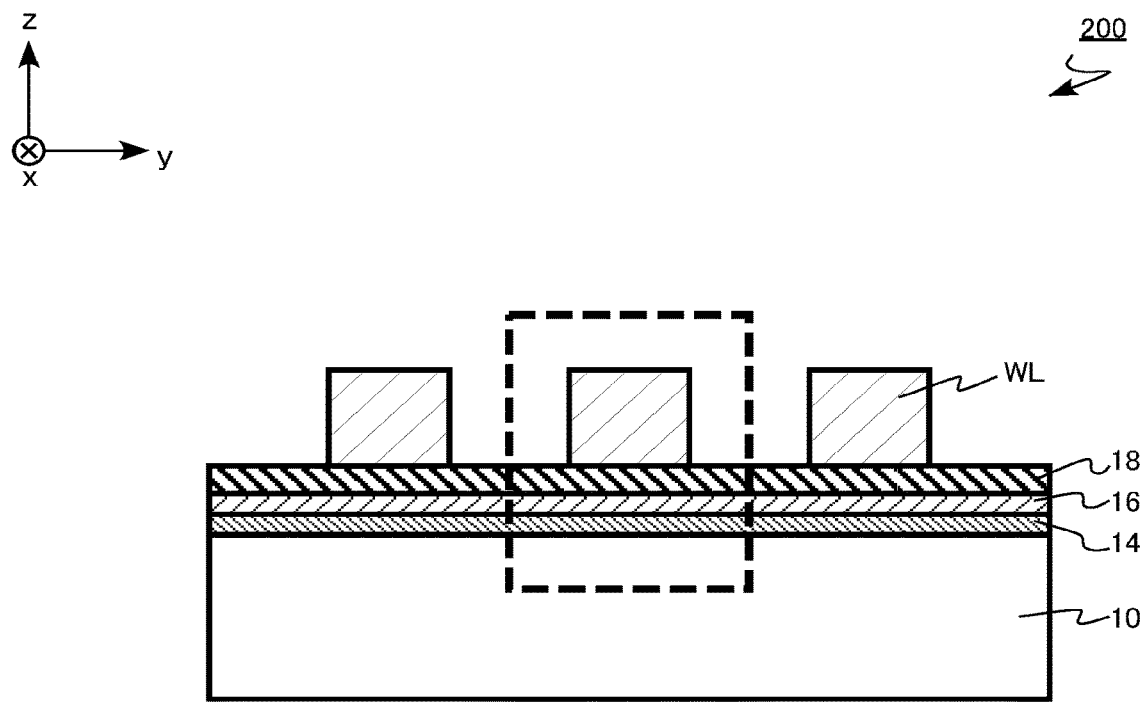
FIG. 19 is a schematic cross-sectional view of a memory cell array of a semiconductor memory device according to the second embodiment.

FIG. 19 is a schematic cross-sectional view of a memory cell array of the semiconductor memory device according to the second embodiment. FIG. 19 is a yx cross-sectional view of a memory cell array 200. In FIG. 19, the region surrounded by the broken line is one memory cell.

Figure 20:
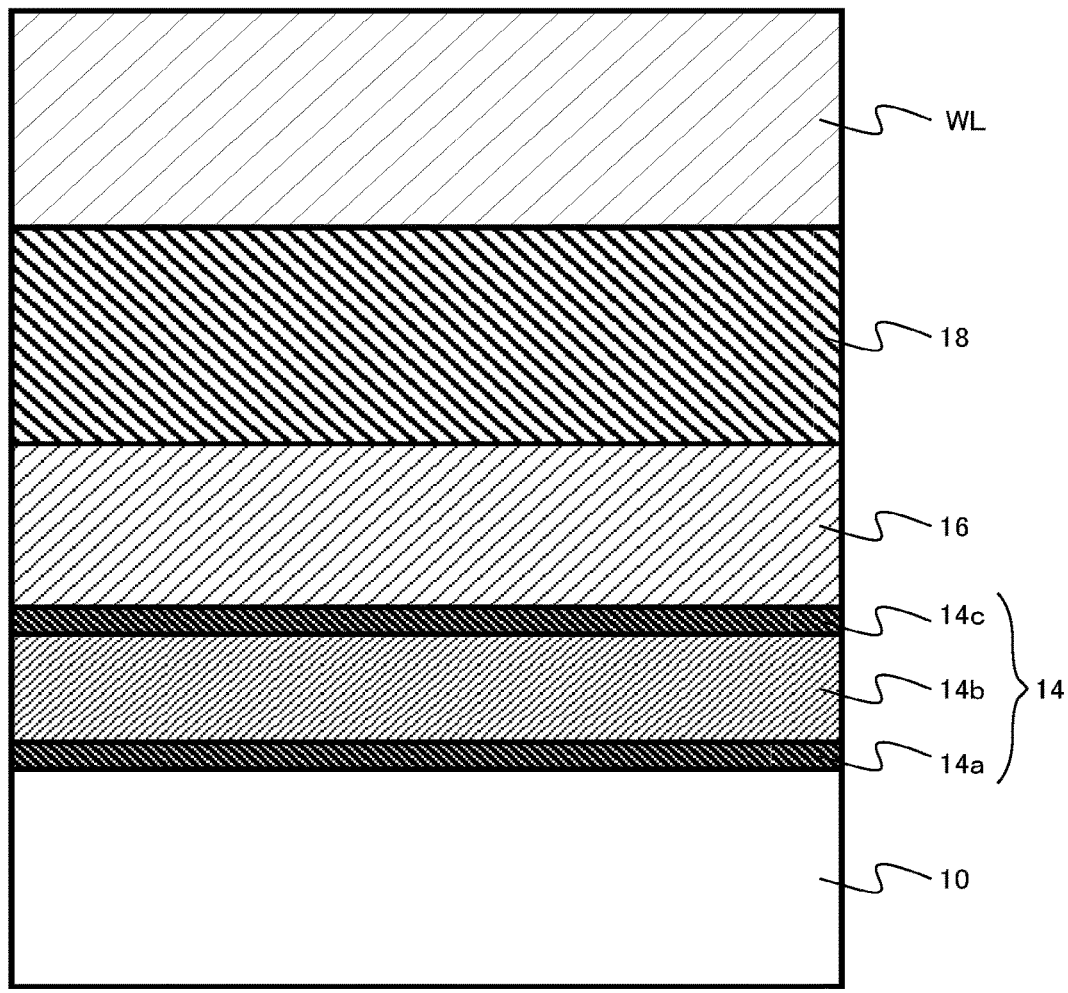
FIG. 20 is a schematic cross-sectional view of a memory cell of the semiconductor memory device according to the second embodiment.

FIG. 20 is a schematic cross-sectional view of the memory cell of the semiconductor memory device according to the second embodiment. FIG. 20 is an enlarged cross-sectional view of a part of the memory cell.

As shown in FIG. 19, the memory cell array 200 includes a plurality of word lines WL, a semiconductor layer 10, a tunnel insulating layer 14, a charge storage layer 16, and a block insulating layer 18.

The tunnel insulating layer 14 includes a lower layer portion 14a, an intermediate portion 14b, and an upper layer portion 14c.

The word line WL is an example of a gate electrode layer. The tunnel insulating layer 14 is an example of a first insulating layer. The block insulating layer 18 is an example of a second insulating layer.

The face of the semiconductor layer 10 is parallel to the xy plane. The semiconductor layer 10 functions as a channel of the memory cell transistor MT.

The semiconductor layer 10 is, for example, a polycrystalline semiconductor. The semiconductor layer 10 is, for example, polycrystalline silicon. The semiconductor layer 10 contains, for example, fluorine (F).

The tunnel insulating layer 14 is provided on the semiconductor layer 10. The tunnel insulating layer 14 is provided between the semiconductor layer 10 and at least one of the plurality of word lines WL. The tunnel insulating layer 14 is provided between the semiconductor layer 10 and the charge storage layer 16.

The tunnel insulating layer 14 has a function of passing charges according to the voltage applied between the word lines WL and the semiconductor layer 10.

The tunnel insulating layer 14 contains silicon (Si), nitrogen (N), and fluorine (F). The tunnel insulating layer 14 includes a first region. The first region is at least a part of the tunnel insulating layer 14. The tunnel insulating layer 14 contains oxygen (O), for example.

The tunnel insulating layer 14 contains, for example, silicon nitride or silicon oxynitride. The thickness of the tunnel insulating layer 14 is, for example, 3 nm or more and 8 nm or less.

The tunnel insulating layer 14 includes a lower layer portion 14a, an intermediate portion 14b, and an upper layer portion 14c. The lower layer portion 14a is provided between the semiconductor layer 10 and the intermediate portion 14b. The intermediate portion 14b is provided between the lower layer portion 14a and the upper layer portion 14c. The upper layer portion 14c is provided between the intermediate portion 14b and the charge storage layer 16.

The lower layer portion 14a is, for example, silicon oxide. The intermediate portion 14b is, for example, silicon nitride or silicon oxynitride. The upper layer portion 14c is, for example, silicon oxide.

The charge storage layer 16 is provided on the tunnel insulating layer 14. The charge storage layer 16 is provided between the tunnel insulating layer 14 and the block insulating layer 18.

The charge storage layer 16 has a function of trapping and storing charges. The charge is, for example, an electron. The threshold voltage of the memory cell transistor MT changes according to the amount of charges stored in the charge storage layer 16. By utilizing this change in threshold voltage, one memory cell can store data.

For example, as the threshold voltage of the memory cell transistor MT changes, the voltage at which the memory cell transistor MT turns on changes. For example, if the state where the threshold voltage is high is defined as data "0" and the state where the threshold voltage is low is defined as data "1", the memory cell can store 1-bit data of "0" and "1".

The charge storage layer 16 contains silicon (Si) and nitrogen (N). The charge storage layer 16 contains or does not contain fluorine (F). The charge storage layer 16 includes a second region. The second region is at least a part of the charge storage layer 16.

The charge storage layer 16 contains, for example, silicon nitride or silicon oxynitride. The thickness of the charge storage layer 16 is, for example, 3 nm or more and 10 nm or less.

The block insulating layer 18 is provided on the charge storage layer 16. The block insulating layer 18 is provided between the charge storage layer 16 and the word lines WL. The block insulating layer 18 has a function of blocking a current flowing between the charge storage layer 16 and the word lines WL.

The block insulating layer 18 is, for example, oxide, oxynitride, or nitride. The block insulating layer 18 contains, for example silicon oxide or aluminum oxide.

The word lines WL are provided on the block insulating layer 18. The word lines WL extend in the x direction. The word lines WL are repeatedly disposed in the y direction so as to be apart from each other. The word line WL functions as a control electrode of the memory cell transistor MT.

The word line WL is, for example, metal, metal nitride, metal carbide, or a semiconductor. The word line WL is, for example, tungsten (W). The width of the word line WL in the y direction is, for example, 5 nm or more and 20 nm or less.

A second atomic ratio (N/Si) of nitrogen (N) to silicon (Si) in a second region of the charge storage layer 16 is higher that a first atomic ratio (N/Si) of nitrogen (N) to silicon (Si) in the first region of the tunnel insulating layer 14.

The first atomic ratio (N/Si) is, for example, 1.25 or less. The second atomic ratio (N/Si) is, for example, more than 1.25.

When silicon nitride has a stoichiometric composition (stoichiometry), that is, when silicon nitride has a composition of $Si_3N_4$, the atomic ratio (N/Si) of nitrogen (N) to silicon (Si) is 1.33.

A first fluorine concentration in the first region of the tunnel insulating layer 14 is higher than a second fluorine concentration in the second region of the charge storage layer 16. The first fluorine concentration in the first region is, for example, $2 \times 10^{20}$ atoms/cm$^3$ or more. The second fluorine concentration is, for example, $1 \times 10^{20}$ atoms/cm$^3$ or less.

In the case manufacturing the cell array 200, the tunnel insulating layer 14, the charge storage layer 16, the block insulating layer 18, and the plurality of word lines WL are sequentially formed on the semiconductor layer 10. For example, after the tunnel insulating layer 14 is formed, heat treatment is performed in an atmosphere containing fluorine (F). By this heat treatment, fluorine is introduced into the tunnel insulating layer 14.

As described above, according to the second embodiment, similarly to the first embodiment, it is possible to provide a semiconductor memory device capable of improving the charge retention characteristic by making the trap levels in the band gap of the tunnel insulating layer shallow.

Third Embodiment

A semiconductor memory device according to the third embodiment is different from the semiconductor memory device according to the first embodiment in that a semiconductor layer extends in a direction parallel to a face of a semiconductor substrate. Hereinafter, a part of the description overlapping with that of the first embodiment will be omitted.

The semiconductor memory device according to the third embodiment is a three-dimensional NAND flash memory. A memory cell of the semiconductor memory device according to the third embodiment is a so-called Metal-Oxide-Nitride-Oxide-Semiconductor type (MONOS type) memory cell.

Figure 21:
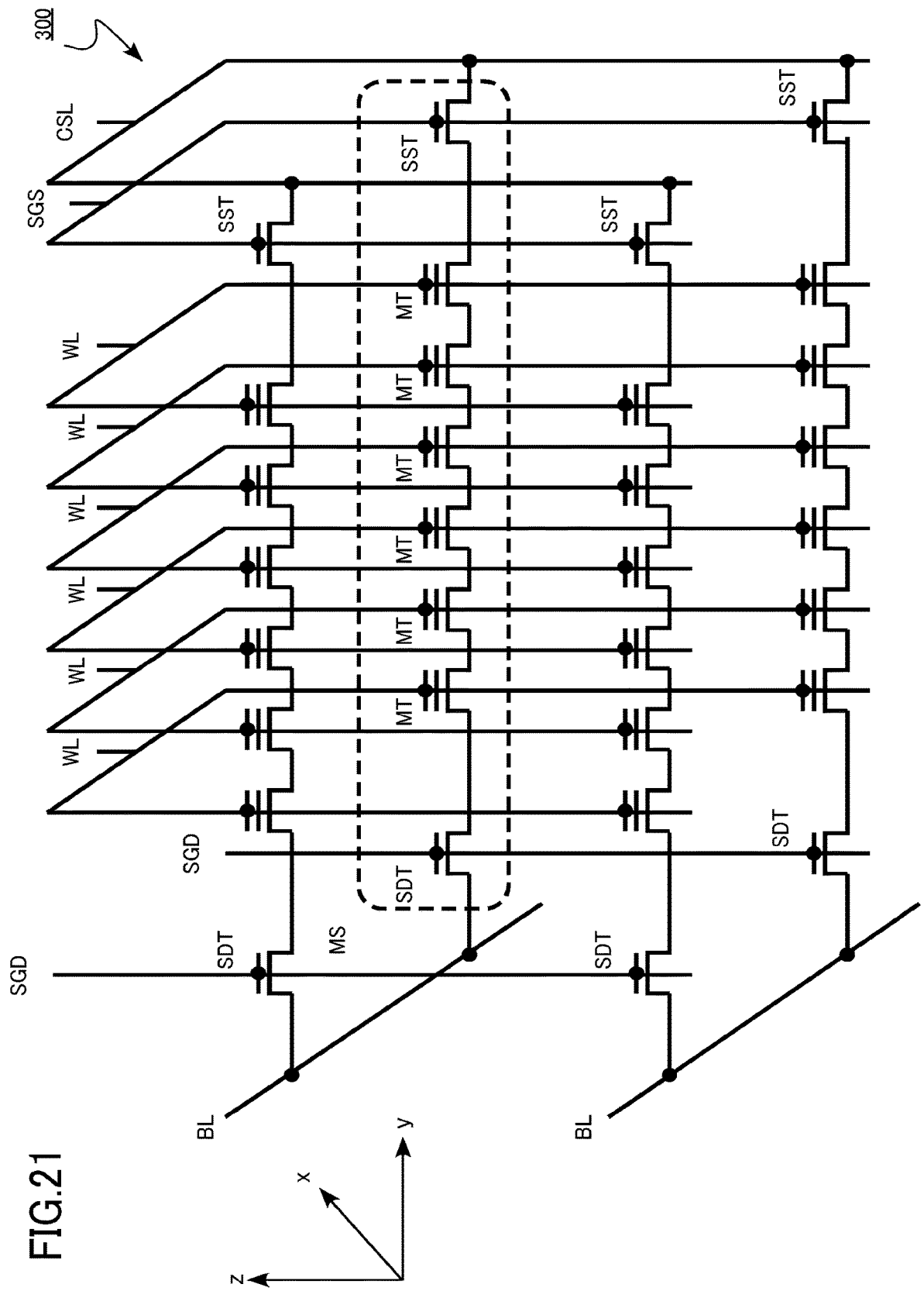
FIG. 21 is a circuit diagram of a memory cell array of a semiconductor memory device according to the third embodiment.

FIG. 21 is a circuit diagram of a memory cell array of the semiconductor memory device according to the third embodiment.

As shown in FIG. 21, a memory cell array 300 of the three-dimensional NAND flash memory according to the third embodiment includes a plurality of word lines WL, a common source line CSL, a source selection gate line SGS, a plurality of drain selection gate lines SGD, a plurality of bit lines BL, and a plurality of memory strings MS. The word line WL is an example of a gate electrode layer.

The plurality of word lines WL are disposed apart from each other in the y direction. The plurality of memory strings MS extend in the y direction. The plurality of bit lines BL extend in the x direction, for example.

Hereinafter, the x direction is defined as the second direction, the y direction is defined as the first direction, and the z direction is defined as the third direction. The x direction, the y direction, and the z direction are, for example, perpendicular to each other.

As shown in FIG. 21, the memory string MS includes a source selection transistor SST, a plurality of memory cells, and a drain selection transistor SDT, which are connected in series between the common source line CSL and the bit line BL. One memory string MS is selected by selecting one bit line BL and one drain selection gate line SGD, and one memory cell can be selected by selecting one word line WL. The word line WL is a gate electrode of a memory cell transistor MT that constitutes the memory cell.

Figure 22:
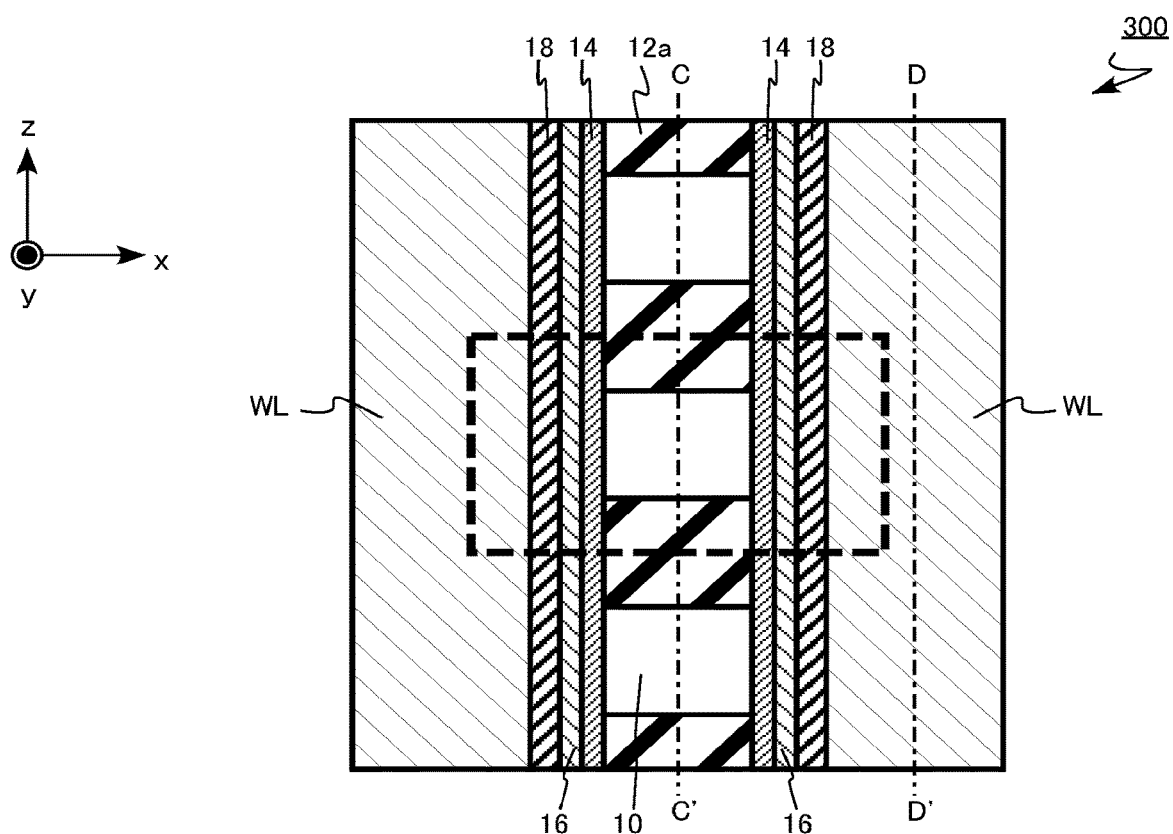
FIG. 22 is a schematic cross-sectional view of the memory cell array of the semiconductor memory device according to the third embodiment.
Figure 23A:
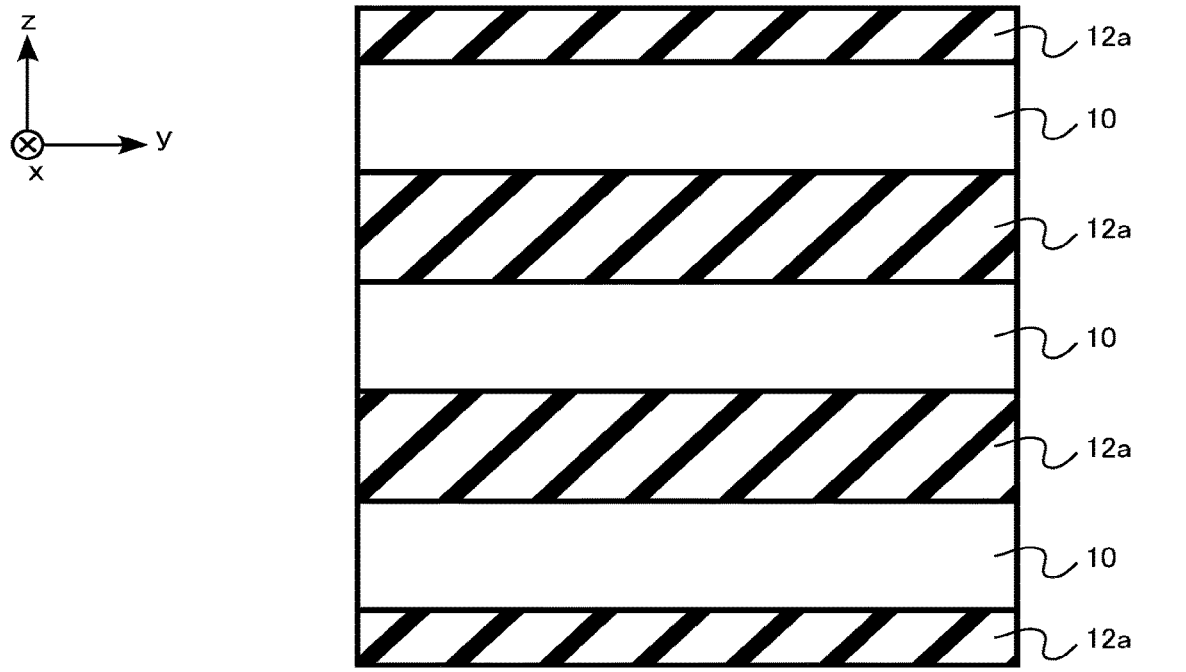
FIGS. 23A and 23B are schematic cross-sectional views of the memory cell array of the semiconductor memory device according to the third embodiment.
Figure 23B:
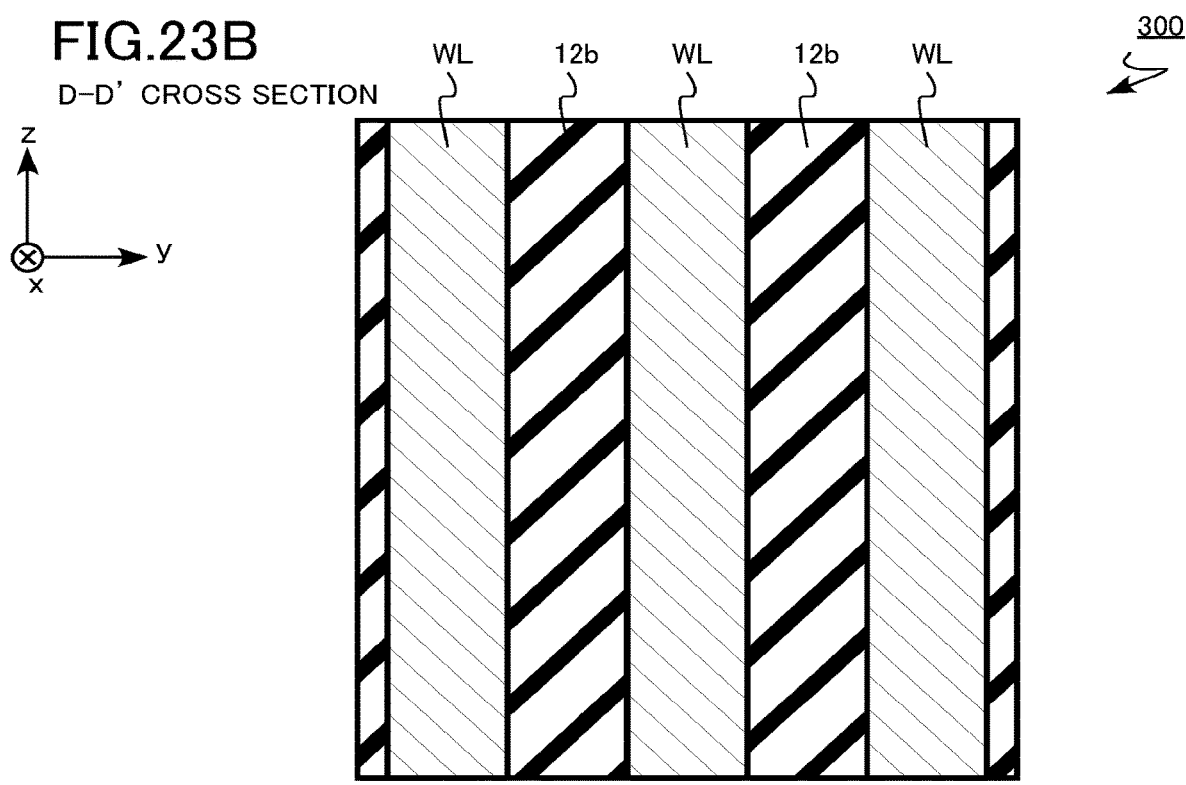

FIG. 22 and FIGS. 23A and 23B are schematic cross-sectional views of the memory cell array of the semiconductor memory device according to the third embodiment. FIG. 22 and FIGS. 23A and 23B each show a cross section of a plurality of memory cells in one memory string MS surrounded by, for example, the dotted line, in the memory cell array 300 of FIG. 21.

FIG. 22 is an xz cross-sectional view of the memory cell array 300. In FIG. 22, the region surrounded by the broken line is one memory cell. FIG. 23A is a cross section taken along the line C-C' of FIG. 22. FIG. 23A is a yz cross-sectional view of the memory cell array 300. FIG. 23B is a cross section taken along line D-D' of FIG. 22. FIG. 23B is a yz cross-sectional view of the memory cell array 300.

FIG. 24 is a schematic cross-sectional view of the memory cell of the semiconductor memory device according to the third embodiment. FIG. 24 is an enlarged cross-sectional view of a part of the memory cell.

As shown in FIG. 22 and FIGS. 23A and 23B, the memory cell array 300 includes the plurality of word lines WL, a semiconductor layer 10, interlayer insulating layers 12a, interlayer insulating layers 12b, a tunnel insulating layer 14, a charge storage layer 16, and a block insulating layer 18.

The tunnel insulating layer 14 includes a lower layer portion 14a, an intermediate portion 14b, and an upper layer portion 14c.

The word line WL is an example of a gate electrode layer. The tunnel insulating layer 14 is an example of a first insulating layer. The block insulating layer 18 is an example of a second insulating layer.

The memory cell array 300 is provided, for example, on a semiconductor substrate (not shown). The semiconductor substrate has a face parallel to the x direction and the y direction.

The word lines WL and the interlayer insulating layers 12b are alternately disposed in the y direction (first direction) on the semiconductor substrate. The word lines WL are disposed apart from each other in the y direction. The word lines WL are repeatedly disposed in the y direction so as to be apart from each other. The word line WL functions as a control electrode of the memory cell transistor MT.

The word line WL is, for example, metal, metal nitride, metal carbide, or a semiconductor. The word line WL is, for example, tungsten (W). The thickness of the word line WL in the y direction is, for example, 5 nm or more and 20 nm or less.

The interlayer insulating layer 12b separates the word line WL from the word line WL. The interlayer insulating layer 12b electrically separates the word line WL from the word line WL. The interlayer insulating layer 12a separates the semiconductor layer 10 from the semiconductor layer 10. The interlayer insulating layer 12a electrically separates the semiconductor layer 10 from the semiconductor layer 10.

The interlayer insulating layer 12a and the interlayer insulating layer 12b are each, for example, oxide, oxynitride, or nitride. The interlayer insulating layer 12a and the interlayer insulating layer 12b are each, for example, silicon oxide. The thickness of the interlayer insulating layer 12a in the z direction is, for example, 5 nm or more and 20 nm or less. The thickness of the interlayer insulating layer 12b in the y direction is, for example, 5 nm or more and 20 nm or less.

The semiconductor layer 10 extends in the y direction. The semiconductor layer 10 extends in a direction parallel to the face of the semiconductor substrate. The semiconductor layer 10 is interposed between the plurality of word lines WL. The semiconductor layer 10 has, for example, a quadrangular prism. The semiconductor layer 10 functions as a channel of the memory cell transistor MT.

The semiconductor layer 10 is, for example, a polycrystalline semiconductor. The semiconductor layer 10 is, for example, polycrystalline silicon. The semiconductor layer 10 contains, for example, fluorine (F).

The tunnel insulating layer 14 is provided between the semiconductor layer 10 and the word lines WL. The tunnel insulating layer 14 is provided between the semiconductor layer 10 and at least one of the plurality of word lines WL. The tunnel insulating layer 14 is provided between the semiconductor layer 10 and the charge storage layer 16.

The tunnel insulating layer 14 has a function of passing charges according to the voltage applied between the word lines WL and the semiconductor layer 10.

The tunnel insulating layer 14 contains silicon (Si), nitrogen (N), and fluorine (F). The tunnel insulating layer 14 includes a first region. The first region is at least a part of the tunnel insulating layer 14. The tunnel insulating layer 14 contains oxygen (O), for example.

The tunnel insulating layer 14 contains, for example, silicon nitride or silicon oxynitride. The thickness of the tunnel insulating layer 14 is, for example, 3 nm or more and 8 nm or less.

The tunnel insulating layer 14 includes a lower layer portion 14a, an intermediate portion 14b, and an upper layer portion 14c. The lower layer portion 14a is provided between the semiconductor layer 10 and the intermediate portion 14b. The intermediate portion 14b is provided between the lower layer portion 14a and the upper layer portion 14c. The upper layer portion 14c is provided between the intermediate portion 14b and the charge storage layer 16.

The lower layer portion 14a is, for example, silicon oxide. The intermediate portion 14b is, for example, silicon nitride or silicon oxynitride. The upper layer portion 14c is, for example, silicon oxide.

The charge storage layer 16 is provided between the tunnel insulating layer 14 and the block insulating layer 18.

The charge storage layer 16 has a function of trapping and storing charges. The charge is, for example, an electron. The threshold voltage of the memory cell transistor MT changes according to the amount of charges stored in the charge storage layer 16. By utilizing this change in threshold voltage, one memory cell can store data.

For example, as the threshold voltage of the memory cell transistor MT changes, the voltage at which the memory cell transistor MT turns on changes. For example, if the state where the threshold voltage is high is defined as data "0" and the state where the threshold voltage is low is defined as data "1", the memory cell can store 1-bit data of "0" and "1".

The charge storage layer 16 contains silicon (Si) and nitrogen (N). The charge storage layer 16 contains or does not contain fluorine (F). The charge storage layer 16 includes a second region. The second region is at least a part of the charge storage layer 16.

The charge storage layer 16 contains, for example, silicon nitride or silicon oxynitride. The thickness of the charge storage layer 16 is, for example, 3 nm or more and 10 nm or less.

The block insulating layer 18 is provided between the tunnel insulating layer 14 and the word lines WL. The block insulating layer 18 is provided between the charge storage layer 16 and the word lines WL. The block insulating layer 18 has a function of blocking a current flowing between the charge storage layer 16 and the word lines WL.

The block insulating layer 18 is, for example, oxide, oxynitride, or nitride. The block insulating layer 18 contains, for example silicon oxide or aluminum oxide.

A second atomic ratio (N/Si) of nitrogen (N) to silicon (Si) in a second region of the charge storage layer 16 is higher that a first atomic ratio (N/Si) of nitrogen (N) to silicon (Si) in the first region of the tunnel insulating layer 14.

The first atomic ratio (N/Si) is, for example, 1.25 or less. The second atomic ratio (N/Si) is, for example, more than 1.25.

When silicon nitride has a stoichiometric composition (stoichiometry), that is, when silicon nitride has a composition of $Si_3N_4$, the atomic ratio (N/Si) of nitrogen (N) to silicon (Si) is 1.33.

As described above, according to the third embodiment, similarly to the first embodiment, it is possible to provide a semiconductor memory device capable of improving the charge retention characteristic by making the trap levels in the band gap of the tunnel insulating layer shallow.

In the first embodiment, the case where the interlayer insulating layer 12 is provided between the word lines WL has been described as an example, but a space may be provided between the word lines WL, for example.

In the first embodiment, the structure in which the semiconductor layer 10 is surrounded by the word lines WL has been described as an example, but the semiconductor layer 10 may be interposed between the word lines WL divided into two. With this structure, the number of memory cells in the stacked body 30 can be doubled.

Further, in the first embodiment, the structure in which one semiconductor layer 10 is provided in one memory hole 54 has been described as an example, but a plurality of semiconductor layers 10 divided into two or more may be provided in one memory hole 54. With this structure, the number of memory cells in the stacked body 30 can be doubled or more.

While certain embodiments have been described, these embodiments have been presented by way of example only, and are not intended to limit the scope of the inventions. Indeed, the semiconductor memory devices and the manufacturing methods therefor described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a semiconductor layer;
   a gate electrode layer;
   a first insulating layer provided between the semiconductor layer and the gate electrode layer, the first insulating layer containing silicon (Si), nitrogen (N), and fluorine (F), and the first insulating layer including a first region;
   a second insulating layer provided between the first insulating layer and the gate electrode layer; and
   a charge storage layer provided between the first insulating layer and the second insulating layer, the charge storage layer containing silicon (Si) and nitrogen (N), the charge storage layer containing or not containing fluorine (F), and the charge storage layer including a second region,
   wherein a second atomic ratio (N/Si) of nitrogen (N) to silicon (Si) in the second region is larger than a first atomic ratio (N/Si) of nitrogen (N) to silicon (Si) in the first region, and
   wherein a first fluorine concentration in the first region is higher than a second fluorine concentration in the second region.

2. The semiconductor memory device according to claim 1, wherein the first atomic ratio is 1.25 or less.

3. The semiconductor memory device according to claim 1, wherein the second atomic ratio is more than 1.25.

4. The semiconductor memory device according to claim 1, wherein the first fluorine concentration is $2 \times 10^{20}$ atoms/cm$^{-3}$ or more.

5. The semiconductor memory device according to claim 1, wherein the second fluorine concentration is $1 \times 10^{20}$ atoms/cm$^3$ or less.

6. The semiconductor memory device according to claim 1, wherein the first insulating layer contains oxygen (O).

7. The semiconductor memory device according to claim 1, wherein the first insulating layer contains silicon nitride or silicon oxynitride.

8. The semiconductor memory device according to claim 1, wherein the charge storage layer contains silicon nitride.

9. The semiconductor memory device according to claim 1, wherein the semiconductor layer contains fluorine (F).

10. A semiconductor memory device comprising:
    a plurality of gate electrode layers disposed in a first direction so as to be spaced apart from each other;
    a semiconductor layer extending in the first direction;
    a first insulating layer provided between the semiconductor layer and at least one gate electrode layer of the plurality of gate electrode layers, the first insulating layer containing silicon (Si), nitrogen (N), and fluorine (F), and the first insulating layer including a first region;
    a second insulating layer provided between the first insulating layer and the at least one gate electrode layer; and
    a charge storage layer provided between the first insulating layer and the second insulating layer, the charge storage layer containing silicon (Si) and nitrogen (N), the charge storage layer containing or not containing fluorine (F), and the charge storage layer including a second region,
    wherein a second atomic ratio (N/Si) of nitrogen (N) to silicon (Si) in the second region is larger than a first atomic ratio (N/Si) of nitrogen (N) to silicon (Si) in the first region, and
    wherein a first fluorine concentration in the first region is higher than a second fluorine concentration in the second region.

11. The semiconductor memory device according to claim 10, wherein the first atomic ratio is 1.25 or less.

12. The semiconductor memory device according to claim 10, wherein the first insulating layer contains silicon nitride or silicon oxynitride.

13. The semiconductor memory device according to claim 10, wherein the charge storage layer contains silicon nitride.

14. The semiconductor memory device according to claim 10, further comprising a columnar insulating region extending in the first direction, the columnar insulating region being surrounded by the semiconductor layer, and the columnar insulating region containing fluorine (F).

15. The semiconductor memory device according to claim 10, wherein the semiconductor layer is surrounded by the plurality of gate electrode layers.

* * * * *